(12) United States Patent
Hosotani et al.

(10) Patent No.: US 7,357,288 B2
(45) Date of Patent: Apr. 15, 2008

(54) COMPONENT CONNECTING APPARATUS

(75) Inventors: Naoto Hosotani, Osaka (JP); Kazuki Fukada, Osaka (JP); Keiichi Iwata, Okayama (JP); Daido Komyoji, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 467 days.

(21) Appl. No.: 10/891,524

(22) Filed: Jul. 15, 2004

(65) Prior Publication Data

US 2005/0034302 A1    Feb. 17, 2005

(30) Foreign Application Priority Data

Jul. 17, 2003 (JP) .............................. 2003-275941
Feb. 9, 2004 (JP) .............................. 2004-031778

(51) Int. Cl.
   *B23K 1/00* (2006.01)
(52) U.S. Cl. ....................... 228/6.2; 228/45; 228/180.1; 219/444.1; 29/740; 29/759; 29/840
(58) Field of Classification Search .......... 29/832–836, 29/840, 843, 740, 743; 228/180.21, 180.22, 228/106, 179.1, 6.2, 3.1, 45, 44.1, 180.1; 219/230, 233, 119, 85.15, 444.1; 156/583.1
See application file for complete search history.

(56) References Cited

U.S. PATENT DOCUMENTS

| | | | | |
|---|---|---|---|---|
| 3,670,396 A | * | 6/1972 | Lindberg | 228/106 |
| 3,722,072 A | * | 3/1973 | Beyerlein | 228/180.21 |
| 4,284,466 A | * | 8/1981 | Chayka et al. | 156/583.1 |
| 4,605,833 A | * | 8/1986 | Lindberg | 219/56.22 |
| 5,058,796 A | * | 10/1991 | Schwarzbauer | 228/44.3 |
| 5,092,510 A | * | 3/1992 | Anstrom et al. | 228/5.5 |
| 5,632,434 A | * | 5/1997 | Evans et al. | 228/44.7 |
| 5,984,165 A | * | 11/1999 | Inoue et al. | 228/180.22 |
| 6,561,408 B2 | * | 5/2003 | Hosotani et al. | 228/44.7 |

FOREIGN PATENT DOCUMENTS

| | | |
|---|---|---|
| JP | 56-115599 | 9/1981 |
| JP | 4-233243 | 8/1992 |
| JP | 6-151032 | 5/1994 |
| JP | 7-326643 | 12/1995 |
| JP | 9-283913 | 10/1997 |
| JP | 10-51133 | 2/1998 |
| JP | 11-307918 | 11/1999 |
| JP | 2002-16352 | 1/2002 |
| JP | 2002-151553 | 5/2002 |

* cited by examiner

*Primary Examiner*—Minh Trinh
(74) *Attorney, Agent, or Firm*—Wenderoth, Lind & Ponack, L.L.P.

(57) ABSTRACT

When a component, that has a connection portion to be connected to an electrode of a board and a weak heat-resistant portion of a lower heat-resisting property than a fusing point of a connection material for connecting the electrode of the board with the connection portion, is connected to the board with interposition of connection material between the electrode of the board and the connection portion, a cooling member is brought into contact with the weak heat-resistant portion or its neighborhood while heating the connection material by heating the board brought in contact with a placement member, and a quantity of heat conducted to the weak heat-resistant portion via the board is reduced by being conducted to the cooling member, thereby performing fusing of the connection material while preventing occurrence of thermal damage to the weak heat-resistant portion.

12 Claims, 21 Drawing Sheets

COMPONENT CONNECTING APPARATUS

BACKGROUND OF THE INVENTION

The present invention relates to a component connecting apparatus and method for connecting a component to a board by use of a heating device and a component mounting apparatus provided with the component connecting apparatus and relates, in particular, to a component connecting apparatus and method for connecting a small-sized low-profile component, that partially has a weak heat-resistant portion of a low heat-resisting property, to a board, and a component mounting apparatus.

Regarding conventional component mounting, an electronic component (a component) to be mounted onto a circuit board (a board) has an electrode connection portion, that is a portion to be connected to an electrode portion of the circuit board, and a component body portion that carries a function of the electronic component. Regarding such electronic component, mounting of the electronic component onto the circuit board is performed by forming and arranging a solder portion of solder or the like, which is a connecting material, between the electrode portion of the circuit board and the electrode connection portion of the electronic component, mounting the electronic component onto the circuit board via the solder portion, thereafter heat-fusing the solder portion and subsequently cooling and solidifying the solder portion.

However, in general, the component body portion of the electronic component often has a lower heat-resisting property than that of the electrode connection portion. If heat in heat-fusing the solder portion is conducted also to the component body portion and a temperature of the component body portion becomes higher than its heatproof temperature, then the component body portion suffers thermal damage, and the electronic component is disadvantageously thermally damaged.

In order to prevent occurrence of the aforementioned problem, with regard to the conventional component mounting, there have been invented apparatuses such that a temperature rise of the component body portion is restrained by removing conducted heat by, for example, blowing a cold blast against the component body portion, and its neighborhood, of the electronic component by a cold blast nozzle concurrently with blowing a hot blast against the electrode connection portion, and its neighborhood, of the electronic component by a hot blast nozzle for heat-fusing of the solder portion (refer to, for example, Japanese unexamined patent publication Nos. H10-51133, H6-151032, H9-283913 or 2002-16352).

Moreover, electronic components have conventionally been mounted on a flexible board (FPC (Flexible Printed Circuit Board)) in order to execute display control of an LCD section and perform electrical connection between an LCD module and a mother board in an LCD module used for a mobile device or the like. A driver IC for display control and chip components of capacitors, and the like, are mounted on this FPC. A connection portion of the driver IC has a narrow pitch, and contamination of the connection portion becomes a cause for degrading reliability of the LCD module. Therefore, the driver IC is normally mounted before mounting of the chip components.

After mounting of the driver IC, as shown in FIG. 28, solder is fed onto the FPC by a solder printer 501 that feeds solder to the FPC, and a chip component is placed on the FPC by a component mounter 502. Then, this resulting FPC is conveyed into a reflow apparatus 503 that has a heat source for fusing the solder, and the solder is fused to connect the chip component to the FPC. In this case, this circuit board can also be conveyed by a belt conveyer if its thickness is about 1 mm and has rigidity. However, in case of a flexible film-shaped circuit board of, for example, the aforementioned FPC, as shown in FIG. 29, there is adopted a method for aligning and fixing FPC's 505 on a pallet 504 and conveying the FPC's 505 into the reflow apparatus 503. In this case, the reflow apparatus 503 is a reflow apparatus that heats atmosphere inside a furnace and performs collective connection of the FPC's 505 on the pallet 504 with solder.

Moreover, when FPC's 505 of different types are produced, the FPC's 505, on which components corresponding to the types are mounted, are conveyed. In this case, productivity is poor with a reflow apparatus that heats an atmosphere inside a furnace, and it is more efficient to heat only required portions. Therefore, a reflow apparatus of local heating with a light beam system as shown in FIG. 30 is effective. In particular, to prevent light from being applied to portions other than the required portions, it is effective to apply light emitted from a light emitting section 511 to the required portions through an opening 513 of a mask 512. It is to be noted that reference numerals 506, 507 and 508 denote a chip component, IC and solder, respectively, in FIG. 30.

When FPC's 505 of the same type are mass-produced, productivity is rather improved by arranging the FPC's 505 on a largest possible pallet 504 and performing connection with solder at a stroke. However, it has recently been often a case where there is insufficient time for processes from determination of specifications of a circuit board to production due to short product life, diversification of models, complication of design ascribed to advanced functions and flowability of market trend. Accordingly, it has become difficult to increase production efficiency by a mass-production method with the large pallet 504.

Moreover, a production facility as shown in FIG. 28 is originally intended for processing large-size boards, and therefore, an apparatus itself is large. Particularly, the reflow apparatus, which heats the atmosphere inside the furnace, generally has a length of 3 to 5 m for soak heating. Equipment is extremely large with respect to a size of a circuit board that has a size of about 2 to 30 mm, and it is difficult to take flexible measures. It is to be noted that a system equipped with the solder printer 501, the component mounter 502 and the reflow apparatus 503 shown in FIG. 28 has a total length extended up to, for example, 7 m.

Moreover, although the light beam system is effective in a case of same components and a small amount of components, it is a recent tendency that an amount and types of chip components 506 on FPC 505 are increasing in accordance with functional advancement of an LCD module. When components of different light absorption coefficients exist on the FPC 505, a setting of light application conditions and the like becomes difficult. For example, it is one method to control conditions by the mask 512 for, for example, black electronic components and weak heat-resistant electronic components. However, there is a limitation in coping with each individual component only with the mask 512 because of a possible occurrence of a semi-fused state of adjacent solder.

On the other hand, in order to cope with the aforementioned problems, there has been invented a apparatus that performs heat-fusing of solder by providing a heating device for a stage on which a circuit board is placed instead of heating an atmosphere around the circuit board and heating the circuit board via the stage (refer to, for example, Japanese unexamined patent publication No. 2002-151553). In such apparatus, the circuit board is directly heated instead of heating the atmosphere around the circuit board, and therefore, energy necessary for heating by the apparatus can be more efficiently used for heat-fusing of solder.

SUMMARY OF THE INVENTION

In the current situation in which components to be mounted tend to be diversified into various types, functionally advanced and scaled down in terms of size and thickness, it is sometimes a case where a specific material is employed in part of a component body portion in order to achieve diversification into various types and advanced functions while allowing a heat-resisting property of an entire component body portion to be improved by development and advancement of materials for forming the electronic components, and the part is a weak heat-resistant portion that has a lower heat-resisting property. For example, there is an electronic component with a built-in CCD as the electronic component, and there is a color filter or the like as the weak heat-resistant portion arranged on this built-in CCD.

However, such weak heat-resistant portion is sometimes arranged close to an electrode connection portion. In this case, it is sometimes a case where the weak heat-resistant portion positioned close to the electrode connection portion to be heated cannot sufficiently be cooled by a conventional method although the component body portion can be roughly wholly cooled. In this case, there is a problem in that the weak heat-resistant portion disadvantageously suffers thermal damage and becomes unable to function as an electronic component. Moreover, such problems tend to become significant as the electronic components are scaled down in terms of size and reduced in thickness.

Accordingly, it is a real situation that, in mounting such electronic component onto a circuit board, the electronic component is mounted onto the circuit board by manual soldering by an operator in order to prevent thermal damage to the weak heat-resistant portion. It is a matter of course that efficient component mounting cannot be achieved by such manner, and this leads to a problem in that automation of this operation is also difficult.

Furthermore, diversification of circuit boards and electronic components to be mounted on the circuit boards are increasingly promoted. Particularly in case of a circuit board of which a thickness tends to be reduced, the circuit board itself tends to warp, bend or the like. The aforementioned system, in which heat is conducted to the circuit board via the stage, has a problem in that it is a case where contact between the stage and the circuit board becomes insufficient and heat conduction becomes insufficient, thereby possibly causing a case where heat-fusing of solder cannot be achieved reliably and efficiently.

Accordingly, an object of the present invention is to solve the aforementioned problems and provide a component connecting apparatus and method and a component mounting apparatus, capable of reliably connecting a component to a circuit board and achieving high productivity by performing heat-fusing of a connection material when a component, that has a connection portion to be connected to an electrode of a board and a weak heat-resistant portion of a lower heat-resisting property than a fusing point of a connection material for connecting the electrode of the board with the connection portion, is connected to the board with interposition of the connection material between the electrode of the board and the connection portion, by performing heat-fusing of the connection material while preventing occurrence of thermal damage to the weak heat-resistant portion.

In order to achieve the aforementioned object, the present invention is constructed as follows.

According to a first aspect of the present invention, there is provided a component connecting apparatus comprising:

a placement member on which a board is placed, the board receiving thereon a component that has a connection portion to be connected to an electrode of the board and a weak heat-resistant portion (particularly a weak heat-resistant portion arranged in the neighborhood of the connection portion) of a heatproof temperature lower than a fusing point of a connection material for connecting the electrode of the board and the connection portion to each other with interposition of the connection material between the electrode of the board and the connection portion;

a heating device for fusing the connection material by heating the placement member to heat the board brought into contact with the placement member; and a weak heat-resistant portion cooling device for cooling the weak heat-resistant portion or its neighborhood so as to prevent thermal damage to the weak heat-resistant portion by reducing a quantity of heat conducted from the heating device to the weak heat-resistant portion via the board (the placement member and the connection portion), whereby the component is connected to the board which is placed on the placement member with interposition of the connection material by fusing the connection material by the heating device while performing cooling by the weak heat-resistant portion cooling device, and solidifying this fused connection material.

According to a second aspect of the present invention, there is provided the component connecting apparatus as defined in the first aspect, wherein the weak heat-resistant portion cooling device comprises a cooling member for performing the cooling by coming into contact with the weak heat-resistant portion or its neighborhood, thereby conducting the quantity of heat from the component.

According to a third aspect of the present invention, there is provided the component connecting apparatus as defined in the second aspect, wherein the cooling by the cooling member is performed so that a temperature of the weak heat-resistant portion becomes equal to or lower than its heatproof temperature when the connection material is fused by the heating device.

According to a fourth aspect of the present invention, there is provided the component connecting apparatus as defined in the second aspect, wherein the weak heat-resistant portion is arranged inside the component, and the cooling member is brought into indirect contact with the weak heat-resistant portion via the neighborhood (external surface of the component) of the weak heat-resistant portion.

According to a fifth aspect of the present invention, there is provided the component connecting apparatus as defined in the second aspect, wherein the cooling member is brought into indirect contact with the weak heat-resistant portion via the board.

According to a sixth aspect of the present invention, there is provided the component connecting apparatus as defined in the second aspect, wherein the placement member has a placement surface which is brought into contact with a part of the board in a neighborhood of a position in which the electrode of the board is formed (i.e., in a position (region) of another surface corresponding to a position (region) in which the electrode is formed on one surface of the board) and on which the board is placed.

According to a seventh aspect of the present invention, there is provided the component connecting apparatus as defined in the second aspect, further comprising a suction device which is connected to the placement member and makes the placement member suck and hold the board.

According to an eighth aspect of the present invention, there is provided the component connecting apparatus as defined in the second aspect, wherein the cooling member has a cooling fluid passage for allowing a cooling fluid to pass therethrough, and the quantity of heat conducted from the component to the cooling member can be removed by making the cooling fluid pass through the cooling fluid passage.

According to a ninth aspect of the present invention, there is provided the component connecting apparatus as defined in the second aspect, wherein the weak heat-resistant portion cooling device further comprises a cooling member moving unit for moving the cooling member between a position of contact of the cooling member and a position in which this contact can be released.

According to a tenth aspect of the present invention, there is provided the component connecting apparatus as defined in the ninth aspect, wherein the weak heat-resistant portion cooling device has the cooling member opposite to the placement member, and by positioning the cooling member in the position of contact by the cooling member moving unit, a position, where the board is mounted, is placed on the placement member, is retained.

According to an eleventh aspect of the present invention, there is provided the component connecting apparatus as defined in the second aspect, wherein the cooling member is formed of a material whose thermal conductivity is higher than thermal conductivity of a formation material of the component.

According to a twelfth aspect of the present invention, there is provided the component connecting apparatus as defined in the second aspect, further comprising a control unit for controlling a temperature of the placement member at a constant temperature by the heating device, and the control unit controls a heating temperature profile of the connection material and a temperature profile of the weak heat-resistant portion by controlling a time of contact between the placement member, whose temperature is controlled at the constant temperature, and the board, and a time of contact between the cooling member and the component.

According to a thirteenth aspect of the present invention, there is provided the component connecting apparatus as defined in the first aspect, wherein the heating device has a heating member for heating the placement member, and the component connecting apparatus further comprises a pressurizing unit for pressurizing the board against the heating member so as to make the board closely fit the placement member and make the placement member closely fit the heating member.

According to a fourteenth aspect of the present invention, there is provided the component connecting apparatus as defined in the thirteenth aspect, wherein the pressurizing unit comprises a plurality of protruding portions or configured portions, and the board is pressurized against the heating member via the protruding portions or the configured portions.

According to a fifteenth aspect of the present invention, there is provided a component mounting apparatus comprising:

a component placement apparatus for placing a component on a board with interposition of connection material; and the component connecting apparatus defined in the second aspect, for connecting the component, which has been placed on the board by the component placing apparatus, to the board.

According to a sixteenth aspect of the present invention, there is provided a component connecting method comprising:

placing a board on a placement member, the board receiving thereon a component that has a connection portion to be connected to an electrode of the board and a weak heat-resistant portion (particularly a weak heat-resistant portion arranged in a neighborhood of the connection portion) of a heatproof temperature lower than a fusing point of a connection material for connecting the electrode of the board and the connection portion to each other with interposition of the connection material between the electrode of the board and the connection portion;

bringing a cooling member into contact with the weak heat-resistant portion or its neighborhood while heating the connection material by heating the board brought in contact with the placement member, reducing a quantity of heat conducted to the weak heat-resistant portion via the board (the placement member and the connection portion) by conducting a quantity of heat to the cooling member, and fusing the connection material while maintaining a temperature of the weak heat-resistant portion at or below its heatproof temperature; and connecting the component to the board with interposition of the connection material by subsequently solidifying the connection material.

According to a seventeenth aspect of the present invention, there is provided the component connecting method as defined in the sixteenth aspect, wherein the weak heat-resistant portion is arranged inside the component, and the cooling member is brought into indirect contact with the weak heat-resistant portion via the neighborhood of the weak heat-resistant portion.

According to an eighteenth aspect of the present invention, there is provided the component connecting method as defined in the sixteenth aspect, wherein a temperature rise in the weak heat-resistant portion is restrained so that a temperature of the weak heat-resistant portion becomes equal to or lower than the heatproof temperature by a time when a temperature of the connection material is maintained at a temperature not lower than its fusing point by heating of the board, and fusing of the connection material is completed.

According to a nineteenth aspect of the present invention, there is provided the component connecting method as defined in the sixteenth aspect, wherein the placement member is maintained at a constant heating temperature, and by controlling a time of contact between the placement member and the board and a time of contact between the cooling member and the component, a heating temperature profile of the connection material and a temperature profile of the weak heat-resistant portion are controlled.

According to a twentieth aspect of the present invention, there is provided the component connecting method as defined in the sixteenth aspect, wherein the board placed on the placement member is pressurized against the placement member to make the board closely fit the placement member, and the board is heated via the placement member.

Moreover, according to another aspect of the present invention, there is employed an electronic component connecting apparatus provided with a placement member that has placed thereon a circuit board on which an electronic component is mounted, a heating device that fuses connection material for connecting the electronic component to the circuit board by heating the circuit board brought into contact with the placement member by heating the placement member by use of the heating device, and a pressurizing unit for pressurizing the placement member and the circuit board against the heating device.

Moreover, it is acceptable to employ an electronic component connecting apparatus, in which the pressurizing unit has protruding portions and makes the circuit board and the placement member closely fit the heating device by use of the protruding portions.

Moreover, it is acceptable to employ an electronic component connecting apparatus, in which the pressurizing unit has configured portions and makes the circuit board and the placement member closely fit the heating device by use of the configured portions.

Moreover, it is acceptable to employ an electronic component connecting apparatus, in which the pressurizing unit has protruding portions and configured portions, and makes the circuit board and the placement member closely fit the heating device with interposition of an intermediate member.

It is further acceptable to employ an electronic component connecting apparatus in which the electronic component connecting apparatus is provided with a hot blast device.

It is also acceptable to use an electronic component connecting method characterized in that, by placing a circuit board, on which an electronic component is to be connected by a connection material, on a placement member and depressing a connection material arrangement region on a placement member contact surface of the circuit board brought into contact with the placement member from an upper portion, a region corresponding to a region where the connection material is arranged on an electronic component placing surface of the circuit board on which the electronic component is placed, heating of the circuit board in the connection material arrangement region by such contact is performed while bringing the connection material arrangement region into contact with the placement member to fuse the connection material and connect the electronic component to the circuit board.

According to the first aspect of the present invention, by placing the board, on which a component that has a connection portion for being connected to an electrode of the board and a weak heat-resistant portion of a heatproof temperature lower than a fusing point of a connection material is placed with interposition of the connection material, on a placement member and fusing the connection material by heating the placement member by the heating device and heating the board brought into contact with the placement member, the weak heat-resistant portion or its neighborhood can be cooled by the weak heat-resistant portion cooling device so as to prevent thermal damage to the weak heat-resistant portion by reducing the quantity of heat conducted to the weak heat-resistant portion by such heating. Therefore, occurrence of thermal damage to the weak heat-resistant portion due to the heating can be prevented in advance while performing reliable fusing by heating of the connection material.

For example, in a case where the weak heat-resistant portion is arranged close to the connection portion to such an extent that the quantity of heat conducted via the connection portion due to heating of the connection material thermally damages the weak heat-resistant portion by virtue of the heat-resisting property (i.e., the heat-resisting property that the heatproof temperature of the portion is lower than the fusing point of the connection material) of the weak heat-resistant portion in the component, the conventional reflow apparatus (component connecting apparatus) has had a disadvantage in that, when the weak heat-resistant portion is cooled while heating the connection material, influence of heating or cooling is disadvantageously exerted on the other due to an adjacent arrangement, and it has been difficult to obtain a reliable heat-fusing of the connection material compatible with protection of the weak heat-resistant portion.

Even in this case, by enabling the heat-fusing of the connection material arranged on the electrode of the board by heating the placement member by the heating device and thereby heating the board brought into contact with the heating device, the quantity of heat itself conducted to a main body of the component can be reduced according to the aforementioned first aspect. Moreover, cooling by the weak heat-resistant portion cooling device can be performed locally in the weak heat-resistant portion or its neighborhood. Therefore, influence on heating due to the cooling can be restrained to a minimum while enabling a reliable reduction in the quantity of heat conducted to the weak heat-resistant portion by the cooling. Therefore, it is possible to provide a component connecting apparatus capable of obtaining reliable heat-fusing of the connection material compatible with protection of the weak heat-resistant portion.

According to the second aspect of the present invention, by virtue of the weak heat-resistant portion cooling device provided with the cooling member that conducts the quantity of heat from the component by coming into contact with the weak heat-resistant portion or its neighborhood, local cooling of the weak heat-resistant portion can be achieved by bringing the cooling member into contact with the component. Moreover, by virtue of heating and cooling both performed by contact, thermal influence exerted on portions other than contact portions can be further reduced. Therefore, even in a case of a mutually adjacent arrangement, reliable heat-fusing of the connection material can be obtained reliably compatible with protection of the weak heat-resistant portion.

According to the third aspect of the present invention, cooling by the cooling member is performed so that a temperature of the weak heat-resistant portion becomes equal to or lower than its heatproof temperature when the connection material is fused via the placement member and the board by the heating device. By this operation, occurrence of thermal damage to the weak heat-resistant portion due to this heating can be prevented in advance.

According to the fourth aspect of the present invention, even in a case where the weak heat-resistant portion is arranged inside the component, by bringing the cooling member into indirect contact with the weak heat-resistant portion via a peripheral portion in the neighborhood of the weak heat-resistant portion, reliable local cooling of the weak heat-resistant portion can be achieved. Particularly, in a case where the weak heat-resistant portion is arranged inside the component without being exposed to an external surface of the component, it is sometimes difficult to reliably locally cool the weak heat-resistant portion arranged inside by merely blowing cold blast against the main body of the component as, for example, in the conventional case. In this case, there is a problem in that a possibility of occurrence of thermal damage to the weak heat-resistant portion is increased, whereas occurrence of such problem can be solved by the third aspect.

According to the fifth aspect of the present invention, reliable local cooling of the weak heat-resistant portion can be achieved not only in a case where the cooling member is brought into indirect contact with the weak heat-resistant portion via the external surface of the component, but also in a case where the cooling member is brought into indirect contact with the weak heat-resistant portion via the board.

According to the sixth aspect of the present invention, the placement member has the placement surface on which the board is placed so as to be brought into partial contact with the board in the neighborhood of the position in which electrodes are formed on the board, the board can be locally heated at portions of contact between the placement surface and the board, and the quantity of heat in heating the board for heat-fusing of the connection material can be made a necessary minimum. The quantity of heat conducted to the weak heat-resistant portion can be reduced while enabling efficient heat-fusing.

According to the seventh aspect of the present invention, by further providing the suction device, which is connected to the placement member and sucks and holds the board on the placement member, the board placed on the placement member can be made to closely fit the placement member. Therefore, thermal conductivity from the placement member to the board can be improved, thereby allowing efficient heating to be achieved. This arrangement allows time required for heating for fusing the connection material to be reduced and allows an integrated quantity of the quantity of heat to the weak heat-resistant portion by this heating to be reduced, by which occurrence of thermal damage to the weak heat-resistant portion can be more reliably prevented.

According to the eighth aspect of the present invention, the cooling member internally has the cooling fluid passage through which a cooling fluid can pass. With an arrangement that quantity of heat conducted from the component to the cooling member can be removed by making the cooling fluid pass through the cooling fluid passage, cooling of the weak heat-resistant portion by contact with the cooling member can be continually stably achieved.

According to the ninth aspect of the present invention, the weak heat-resistant portion cooling device is further provided with the cooling member moving unit that moves the cooling member between the position of contact of the cooling member and the position in which the contact can be released, whereby cooling can be performed in accordance with necessity of this cooling.

According to the tenth aspect of the present invention, the weak heat-resistant portion cooling device is provided with the cooling member opposite to the placement member. By positioning the cooling member in the position of contact by the cooling member moving unit and retaining a placement position of the board on which the component is mounted on the placement member, the board can be made to closely fit the placement member, and heating efficiency can be improved, thereby allowing time required for the heating to be reduced.

According to the eleventh aspect of the present invention, the cooling member is formed of a material that has a thermal conductivity higher than that of formation material of the component. With this arrangement, the quantity of heat conducted to the weak heat-resistant portion or its neighborhood can be more efficiently conducted to the cooling member, and reliable efficient cooling can be achieved.

According to the twelfth aspect of the present invention, the temperature profile necessary for the heat-fusing of the connection material and the temperature profile for preventing thermal damage to the weak heat-resistant portion can be achieved by controlling the time of contact between the board and the placement member and the time of contact between the cooling member and the component. Therefore, prevention of occurrence of thermal damage to the weak heat-resistant portion and reliable fusing of the connection material can be compatibly achieved while allowing a construction of the control unit to be simple.

According to the thirteenth and fourteenth aspects of the present invention, the placement member and the heating device are provided, and heating is performed by the heating device by bringing the circuit board into contact with the placement member of approximately the same size as that of one circuit board. With this arrangement, generation of loss in a case of a small-sized circuit board can be reduced, and heating corresponding to various types of circuit boards can be individually performed. Therefore, circuit boards of diversified small-lot production can be manufactured with higher productivity than in the conventional case.

According to the fifteenth aspect of the present invention, there can be provided a component mounting apparatus capable of obtaining effects of the aforementioned various aspects by adopting a construction integrated with the component placing apparatus.

According to the sixteenth aspect of the present invention, the board, on which the component that has the connection portion for being connected to the electrode of the board and the weak heat-resistant portion of a heatproof temperature lower than the fusing point of the connection material is placed, is put on the placement member, and the placement member is heated by the heating device to heat the board brought into contact with the placement member. By this operation, the quantity of heat conducted to the weak heat-resistant portion by the heating can be reduced by being conducted to the cooling member with the cooling member brought into contact with the weak heat-resistant portion or its neighborhood while fusing the connection material. Moreover, since the temperature of the weak heat-resistant portion is maintained equal to or lower than its heatproof temperature by conduction of the quantity of heat to the cooling member, there is no possibility of occurrence of thermal damage to the weak heat-resistant portion. Accordingly, there can be provided a component connecting method capable of preventing in advance occurrence of thermal damage to the weak heat-resistant portion due to heating while performing reliable fusing by heating of the connection material.

Moreover, according to another aspect of the present invention, a temperature rise in the weak heat-resistant portion is restrained so that a temperature of the weak heat-resistant portion becomes equal to or lower than the heatproof temperature by a time when the temperature of the connection material is maintained at the temperature of not lower than the fusing point by the heating of the board and the fusing of the connection material is completed. With this arrangement, reliable fusing of the connection material can be performed while reliably preventing occurrence of thermal damage to the weak heat-resistant portion due to the heating.

Moreover, by virtue of the provision of the pressurizing unit for holding the circuit board on the placement member, the circuit board can closely fit the placement member, and temperature control of the circuit board can be performed with higher accuracy.

With this arrangement, even when the circuit board is warped or bent, the connection material arrangement region in its entirety can be reliably brought into contact with the heat conducting portion of the placement member regardless of states of regions other than the connection material arrangement region. Therefore, connection of the electronic component to the circuit board can be achieved reliably and efficiently.

Moreover, in a case of a circuit board that has a thickness within a range of 0.02 mm to 1 mm, or a circuit board constructed of a flexible board, a temperature response of the board to heating control by the heating device is good, and therefore, heating can be performed by temperature control appropriate for each type of circuit board.

Moreover, an electronic component mounting apparatus provided with an electronic component connecting apparatus that can obtain effects of the aforementioned aspects can be provided, and a method for connecting a electronic component to a circuit board capable of obtaining effects of the aforementioned aspects can be provided.

Moreover, a mounting system can be a totally compacted mounting system. The system becomes a space-saving mounting system having high energy efficiency.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 7A, 7B, 7C, 7D and 7E are schematic explanatory views showing a procedure of a connecting operation of the component with the built-in CCD to the FPC in the electronic component connecting apparatus, in which FIG. 7A shows a state in which the FPC is fed to a place above a stage, FIG. 7B shows a state in which the FPC is placed on the stage, FIG. 7C shows a state in which the connecting operation of the component with the built-in CCD to the FPC is performed, FIG. 7D shows a state in which placement of the FPC on the stage is released, and FIG. 7E shows a state in which a transport pallet is conveyed;

FIGS. 8A, 8B, 8C and 8D are schematic perspective views showing various forms of the upper-side heatsink, in which FIG. 8A shows a form that has a flat contact portion, FIG. 8B shows a form that has a roughly squared frame-like contact portion, FIG. 8C shows a form that has contact portions at four corners, and FIG. 8D shows a modification example of the contact portions of FIG. 8C;

FIGS. 12A, 12B, 12C, 12D and 12E are schematic explanatory views showing a procedure of a connecting operation of the component with the built-in CCD to the FPC in the electronic component connecting apparatus of the second embodiment, in which FIG. 12A shows a state in which the FPC is fed to a place above a stage, FIG. 12B shows a state in which the FPC is placed on the stage, FIG. 12C shows a state in which the connecting operation of the component with the built-in CCD to the FPC is performed, FIG. 12D shows a state in which placement of the FPC on the stage is released, and FIG. 12E shows a state in which a transport pallet is conveyed;

FIGS. 24A and 24B are views showing still other modification examples of the electronic component connecting apparatus shown in FIG. 14, wherein FIG. 24A shows a modification example in which components are pressurized by a pressurizing member together with a board, and FIG. 24B shows a modification example in which the components are pressurized by use of needles;

DETAILED DESCRIPTION OF THE PREFERRED EMBODIMENTS

Figure 1:
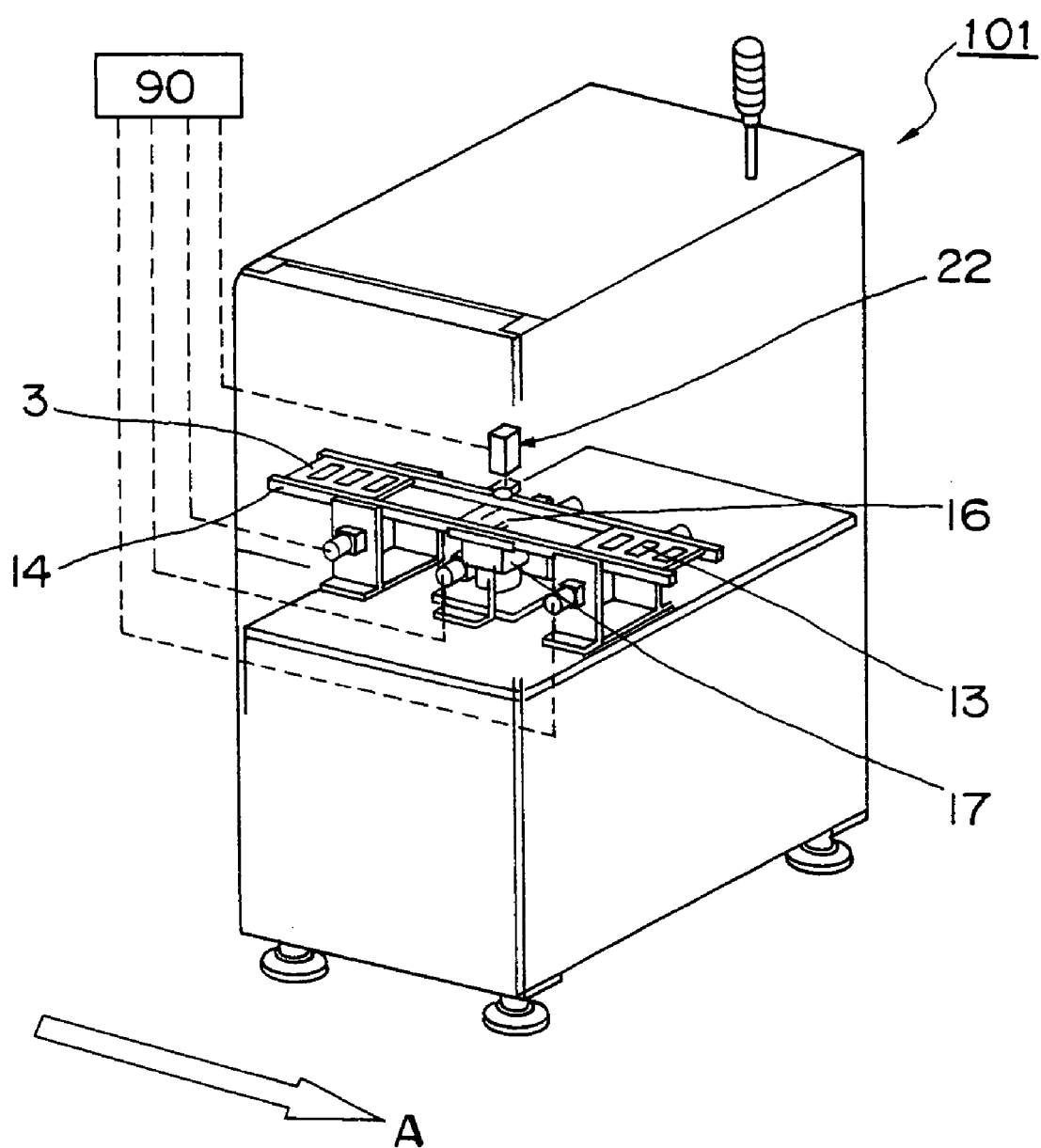
FIG. 1 is a perspective view showing a schematic construction of an electronic component connecting apparatus according to a first embodiment of the present invention.

Before description of the present invention proceeds, it is to be noted that like parts are designated by like reference numerals throughout the accompanying drawings.

A first embodiment of the present invention will be described in detail below with reference to the drawings.

First Embodiment

FIG. 1 shows a schematic external perspective view of an electronic component connecting apparatus 101 of one example of a component connecting apparatus according to the first embodiment of the present invention.

As shown in FIG. 1, the electronic component connecting apparatus 101 is an apparatus for connecting (i.e., mounting) a component, which is placed on an upper surface of a flexible circuit board (hereinafter referred to as an FPC (Flexible Printed Circuit Board)) 3 as one example of a board with interposition of a connection material, to the FPC 3 by heat-fusing (i.e., reflowing) the connection material. It is noted here that the term, "connecting," means a mounting process that is performed by fusing connection material with heat and by thereafter solidifying the connection material, which makes it hard to release a resulting bonding state (i.e., connecting state) by applying external force to a component or board. And in a bonding state an arrangement of the component and the board has been fixed. Before describing a concrete construction of this electronic component connecting apparatus 101, structures of the FPC and the component handled by the above electronic component connecting apparatus 101 will be described below with reference to FIG. 2, which is a schematic sectional view of the FPC 3 on which the component is mounted.

(Structures of Component with Built-in CCD and FPC)

Figure 2:
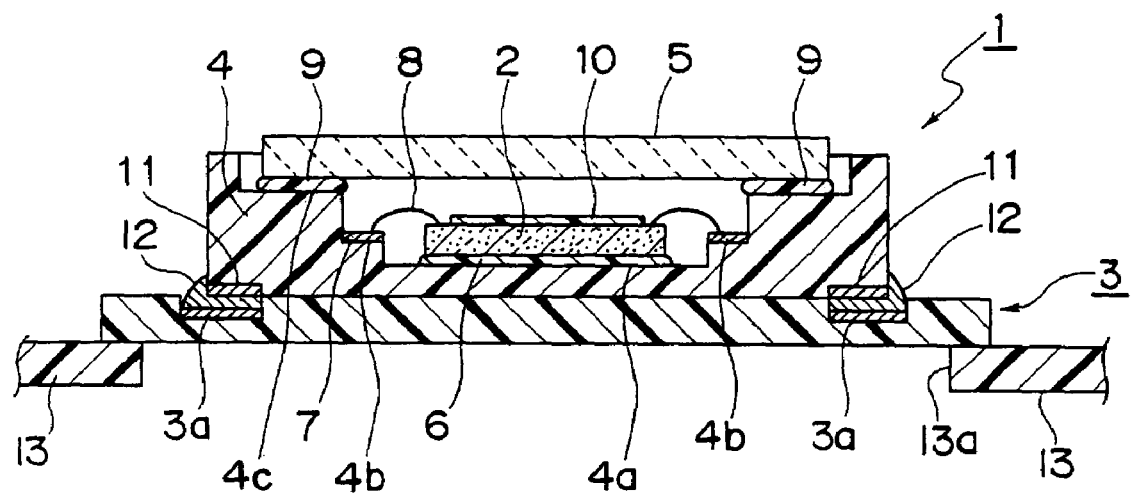
FIG. 2 is a schematic sectional view showing a schematic construction of a component with a built-in CCD and an FPC that are connected together by the electronic component connecting apparatus of FIG. 1.

As shown in FIG. 2, a component 1 with a built-in CCD as one example of an electronic component that has a built-in CCD (Charge Coupled Device) 2 is mounted as the aforementioned component on an upper surface of the FPC 3. The component 1 with the built-in CCD is provided with a package section 4 that is a body with a bottom having a roughly rectangular parallelepiped external shape and a crystal cover section 5 that is a lid section that is mated with an opening located in an upper portion of the package section 4 and hermetically seals an internal space of the package section 4. A CCD 2 is arranged on an internal bottom portion of the package section 4, and an arrangement of the CCD 2 is fixed by a bonding portion 6 formed of an adhesive material. A lower stepped portion 4b and an upper stepped portion 4c, which are two stepped portions, are formed along an inner peripheral surface inside the package section 4. A CCD electrode portion 7 electrically connected to the CCD 2 is formed on the lower stepped portion 4b, and the CCD 2 and the CCD electrode portion 7 are electrically connected to each other via lead wires 8. A peripheral portion of a lower surface of the crystal cover section 5 is bonded to an upper surface of the upper stepped portion 4c via bonding portions 9 formed of an adhesive material. A color filter 10 is arranged on an upper surface of the CCD 2. A space inside the package section 4 in which the CCD 2 is arranged requires airtightness because of functional characteristics of the CCD 2 and the color filter 10. Therefore, an adhesive material having flexibility is used for the bonding portions 9 arranged between the upper stepped portion 4c of the package section 4 and the crystal cover section 5.

A plurality of electrode connection portions 11, as one example of connection portions, connected to a plurality of electrode portions 3a, as one example of electrodes formed on the FPC 3, are formed at lower end portions of the package section 4. An arrangement of the electrode portions 3a of the FPC 3 and the electrode connection portions 11 of the component 1 with the built-in CCD are determined so as to individually correspond to each other, and the component 1 with this built-in CCD is mounted on the upper surface of the FPC 3 via solder portions 12 as one example of connection material arranged between the electrode connection portions 11 and the electrode portions 3a. As shown in FIG. 2, in the above-mentioned mounting state, a bottom portion of the package section 4 closely fits the upper surface of the FPC 3. With this arrangement, the component 1 with the built-in CCD is supported roughly by an entire upper surface of the FPC 3, and the component 1 with the built-in CCD can be mounted on the FPC 3 in a stable state.

Moreover, in the present embodiment, the bonding portions 9 of the crystal cover section 5, the color filter 10 and the bonding portion 6 of the CCD 2 serve as examples of a weak heat-resistant portion having a lower heat-resisting property than that of the solder portions 12, the electrode connection portions 11 and the package section 4. For example, a heatproof temperature (condition) of the bonding portions 9 is not higher than 200° C., a heatproof temperature (condition) of the color filter 10 is not higher than 180° C., and a heatproof temperature (condition) of the bonding portion 6 is not higher than 180° C. A fusing point of the solder portion 12 is 206° C.

Moreover, in the component 1 with the built-in CCD, the weak heat-resistant portions of the bonding portions 9, the bonding portion 6 and the color filter 10 are arranged close to the electrode connection portions 11 to be bonded to the electrode portions 3a of the FPC 3 via respective solder portions 12. In this case, the expression of "arranged close to" means that the weak heat-resistant portions are arranged at a distance such that, as a consequence of conduction of a quantity of heat, for fusing the solder portions 12 also to the electrode connection portions 11 during connection of the electrode connection portions 11 to the electrode portions 3a with interposition of the solder portions 12, such quantity of heat is conducted also to the weak heat-resistant portions, and the weak heat-resistant portions suffer thermal damage due to this conduction of the quantity of heat. The above-mentioned distance is influenced by constituent materials of portions located between the electrode connection portions 11 and each of the weak heat-resistant portions, and a heating temperature of the solder portions 12.

The FPC 3 is a thin type film-shaped flexible board having flexibility. It is to be noted that the FPC 3 to be fed to the electronic component connecting apparatus 101 is in a state in which the component 1 with the built-in CCD has already been mounted on its surface. This mounting is performed in, for example, an electronic component placement device that is installed adjacent to the electronic component connecting apparatus 101 or installed in another place.

(Construction of Electronic Component Connecting Apparatus)

As shown in FIG. 1, the electronic component connecting apparatus 101 is provided with a conveyance unit 14 for conveying a transport pallet 13, which is a support member for transporting three FPC's 3 that are combined as one set arranged on its upper surface, in a conveyance direction A that is rightward in the figure, and a stage 16, which is one example of a placement member on an upper surface of which the FPC's 3, held by the transport pallet 13 conveyed to an approximately central position of the electronic component connecting apparatus 101 by the conveyance unit 14, are placed and on which heating of the FPC's 3 is performed. By placing each FPC 3 on this stage 16, connection of the component 1 with the built-in CCD to FPC 3 is performed as described later. It is to be noted that the conveyance unit 14 is able to convey and feed the FPC 3, (each of the FPC's 3 held on the transport pallet 13) fed to the electronic component connecting apparatus 101, while making the FPC 3 placeable on the stage 16, convey the FPC 3 that has undergone a mounting operation on the stage 16 in the pallet conveyance direction A in a state in which the FPC 3 is still held on the transport pallet 13, and discharge the FPC from the electronic component connecting apparatus 101. The transport pallet 13 has opening portions 13a that are formed slightly smaller than an external shape of the FPC 3 and individually correspond to respective FPC's 3 that are held. For example, as shown in FIG. 2, the FPC's 3 can be held by supporting end portions of lower surfaces of the FPC's 3 by end portions of respective opening portions 13a. That is, as shown in FIG. 2, each FPC 3 is exposed at a corresponding opening portion 13a without being brought into contact with the transport pallet 13 except for end portions on a lower surface side in a state in which the FPC is held on the transport pallet 13. It may be a converse case where the opening portion 13a of the transport pallet 13 is formed larger than the external shape of the FPC 3 instead of the case where the opening portion 13a is formed slightly smaller than the external shape of the FPC 3. However, in this case, it is required to provide structure (mechanism or the like) for securely holding the FPC 3 on the transport pallet 13.

A structure around the stage 16, on which a mounting operation (connecting operation, and this hereinafter holds same) of the component 1 with the built-in CCD onto the FPC 3 in the electronic component connecting apparatus 101 is performed, will be described next with reference to the schematic sectional explanatory view shown in FIG. 3.

Figure 3:
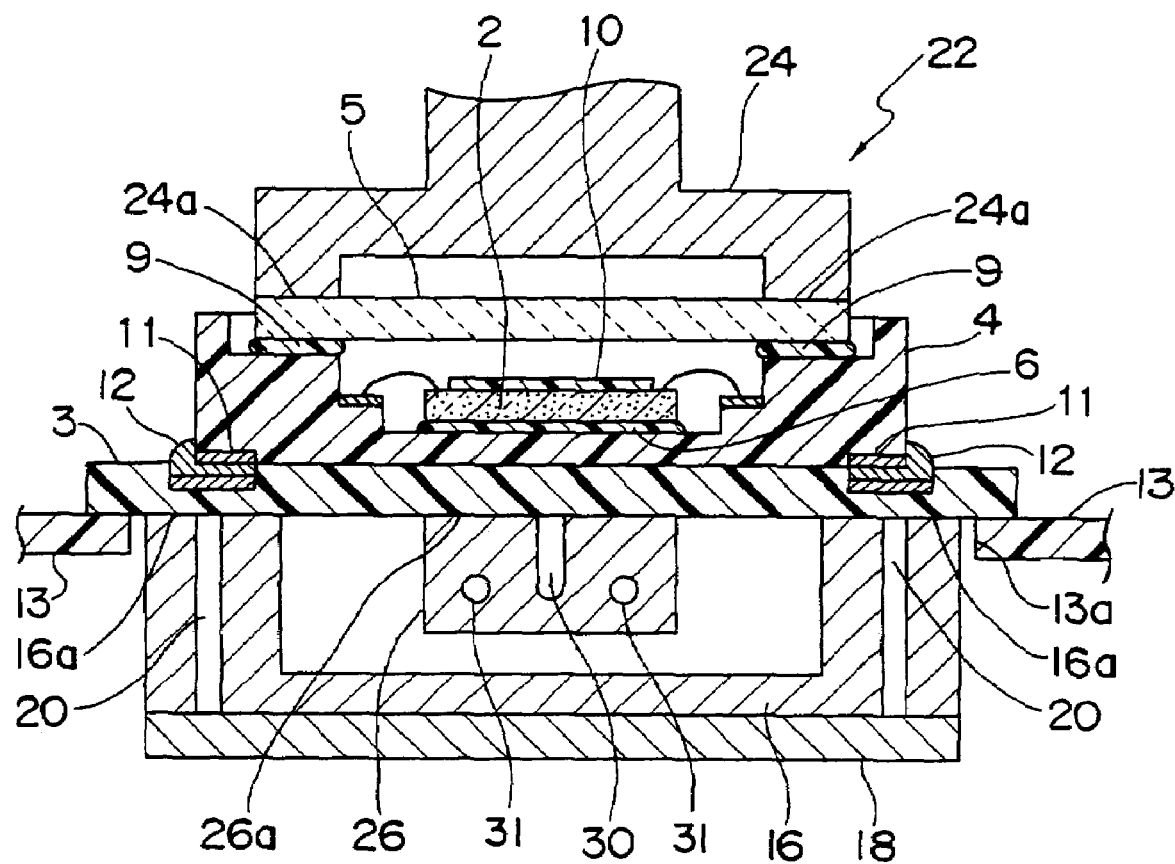
FIG. 3 is a schematic sectional view showing a state in which a connecting operation is performed for the component with the built-in CCD and the FPC of FIG. 2.

As shown in FIG. 3, the electronic component connecting apparatus 101 is provided with stage 16, on which the aforementioned FPC 3 is placed, and a heating device 18 that is installed in contact with a lower surface of this stage 16 and heats the FPC 3 brought into contact with the stage 16 by heating the stage 16.

The stage 16 concurrently has a function to place and hold the FPC 3 and a function to conduct heat to the FPC 3, and is easily replaceable with respect to the heating device 18 so as to be able to cope with various types of boards. Moreover, the stage 16 should preferably be made of a material of good thermal conductivity, such as aluminum, copper, magnesium, ceramic or the like. Particularly, when an aluminum material is used, the material is appropriate in terms of low cost and a soaking property. In this case, the term "soaking property" means uniformity in a surface temperature distribution of an object in a contact portion when, for example, a quantity of heat is applied to the object by contact heat conduction. Moreover, as shown in the schematic perspective view of FIG. 4, the stage 16 has a roughly bracket-shaped planar configuration.

Figure 4:
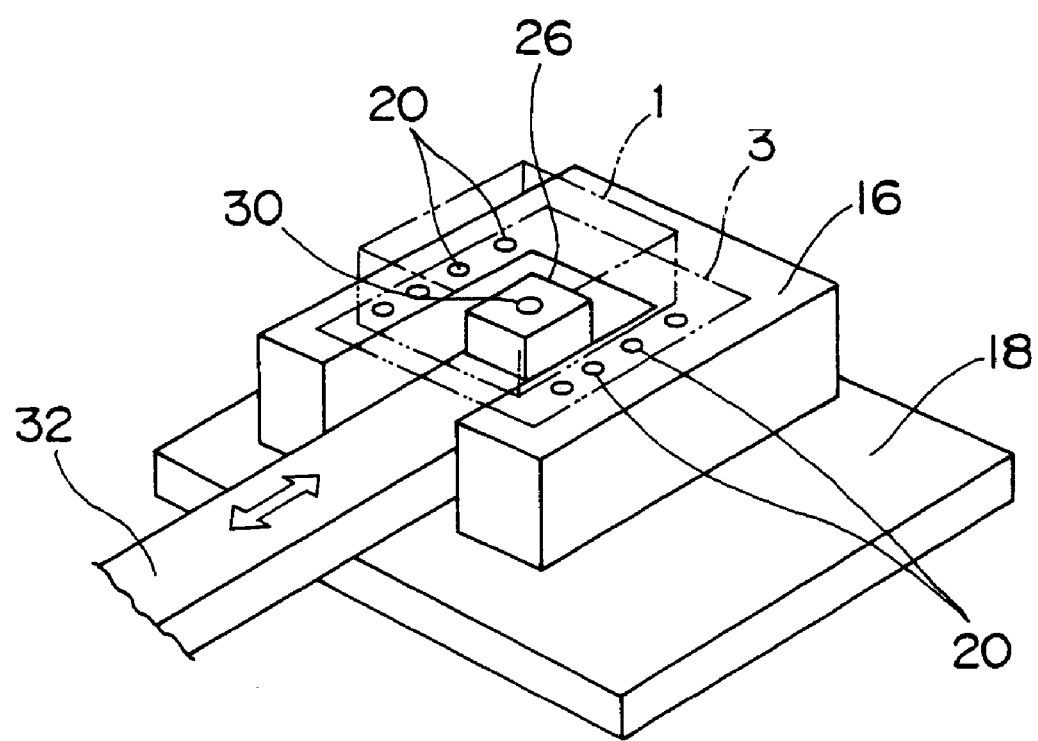
FIG. 4 is a schematic perspective view showing a relation of arrangement among a stage, a heating device and a lower-side heatsink.

Moreover, as shown in FIGS. 3 and 4, a plurality of suction holes 20 for sucking the FPC 3 are opened at a placement surface 16a that is the upper surface of the stage 16 with which a back surface of the FPC 3 is brought into contact. In the present embodiment, portions of the placement surface 16a of the stage 16 are arranged so as to correspond to respective electrode portions 3a of placed FPC 3. It is to be noted that a number and formation positions of the suction holes 20 can be determined in correspondence with the placed FPC 3.

The suction holes 20 are each formed so as to penetrate toward a lower end portion of the stage 16, and a penetration portion is connected to a vacuum suction device (not shown) provided outside the stage 16. By operating the vacuum suction device, the FPC 3 can be sucked by the suction holes 20. Moreover, a pressure gauge (not shown) for measuring a suction pressure force is provided at the vacuum suction device or in a passage located between the vacuum suction device and the penetration portion, thereby making it possible to confirm a suction pressure of the suction holes 20 controllingly or artificially, and thereby securing a reliable suction operation.

The heating device 18 is constructed of, for example, a so-called ceramic heater, and the ceramic heater is arranged closely fitting the lower surface of the stage 16. Such ceramic heater, which is allowed to have a control response characteristic of not longer than one second, is therefore able to cope with various temperature profiles. In a case of a so-called constant heating heater other than the ceramic heater, it takes several tens of seconds to several minutes for temperature rise and temperature fall, and productivity is lowered in a use state in which the temperature rise and temperature fall are required. However, in a use state in which the temperature rise and temperature fall scarcely occur, i.e., in a use state in which a heater temperature is maintained constant, the heater can be used as a comparatively inexpensive heater.

The heating device 18 is further provided with a power supply and a temperature sensor (not shown), and it is possible to control an amount of current supplied from the power supply to the ceramic heater on basis of a temperature detected by the temperature sensor, and control a heating temperature to a desired temperature. The heating device 18 has a surface that is other than a surface brought into contact with the stage 16 and is covered with a heat insulating material (not shown). This arrangement makes it possible to restrain heat radiation from the surface other than this contact surface and efficiently conduct heat of the heating device 18 to the stage 16.

Furthermore, as shown in FIG. 1, the electronic component connecting apparatus 101 is provided with a stage lifter 17, as one example of a placement member elevation unit, for integrally performing an elevational operation of the stage 16 and the heating device 18 between a position, (contact position) in which each portion of placement surface 16a is brought into contact with the lower surface of the FPC 3 positioned above the stage 16 by the conveyance unit 14, and a position (release position) in which such contact can be released. With this arrangement, the FPC 3 arranged above the stage lifter 17 can reliably be placed, and the FPC 3 can be discharged by being conveyed from above the stage 16 by the conveyance unit 14 while releasing placement with downward movement of the stage lifter.

As shown in FIGS. 3 and 4, the electronic component connecting apparatus 101 is further provided with a weak heat-resistant portion cooling device 22 for cooling the weak heat-resistant portions inside the component 1 with the built-in CCD. The weak heat-resistant portion cooling device 22 is provided with an upper-side heatsink 24, as one example of a cooling member capable of cooling the weak heat-resistant portions by heat conduction by coming into contact with the upper surface of the crystal cover section 5 that is an upper portion of the component 1 with the built-in CCD, and a lower-side heatsink 26, as one example of a cooling member capable of cooling the weak heat-resistant portions by heat conduction by coming into contact with the placement portion of the component 1 with the built-in CCD on the FPC 3 from under the FPC 3.

Figure 5:
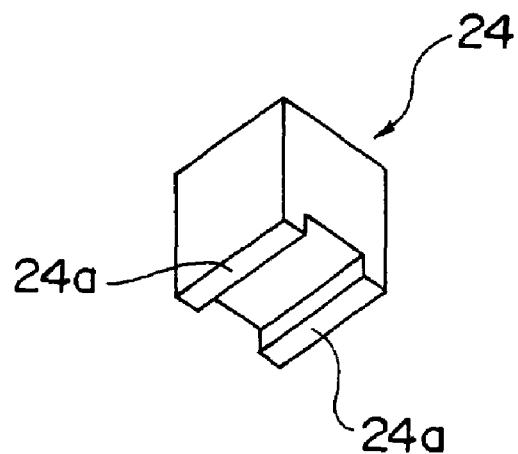
FIG. 5 is a schematic perspective view of an upper-side heatsink.

As shown in FIGS. 3 and 5, the upper-side heatsink 24 has a configuration such that its end portions, which are located on a lower surface side and mutually opposed, are rectangularly raised, and lower-side end surfaces of these rectangularly raised portions serve as contact portions 24a to be brought into contact with the upper surface of the crystal cover section 5 of the component 1 with the built-in CCD. An external configuration on a lower side of the upper-side heatsink 24 is formed so as to have approximately the same size as that of an external shape of the crystal cover section 5, and the contact portions 24a can be brought into contact with respective mutually opposed end portions of the crystal cover section 5. With the upper-side heatsink 24 formed as described above, at least four corner portions of the crystal cover section 5, that has an approximately rectangular planar shape, are reliably brought into contact with any of the contact portions 24a.

A reason why the upper-side heatsink 24 is formed as described above is that it is intended to reduce a quantity of heat caused by heating via the heating device 18, with this heat being conducted to the bonding portions 9 via the FPC 3, the solder portions 12, the electrode connection portions 11 and the package section 4, by conducting the quantity of heat to the contact portions 24a via the crystal cover section 5 in the neighborhood of the bonding portions 9 in consideration of the fact that the bonding portions 9 arranged at a peripheral portion on a lower surface side of the crystal cover section 5 are weak heat-resistant portions. Moreover, a quantity of heat conducted to the bonding portions 9 has a characteristic such that it is easily conducted so as to be concentrated on the bonding portions 9 arranged at the four corner portions of the crystal cover section 5 through experiments. Therefore, by bringing the contact portions 24a into contact with the neighborhood of the bonding portions 9 at least at the four corner portions, a temperature rise of the four corner portions can reliably be restrained. Moreover, in order to allow the above-mentioned function of the upper-side heatsink 24 to be efficiently achieved, the upper-side heatsink 24 is formed of a material of, for example, aluminum (thermal conductivity: 209 W/m·K) or the like, which has high thermal conductivity.

Figure 6:
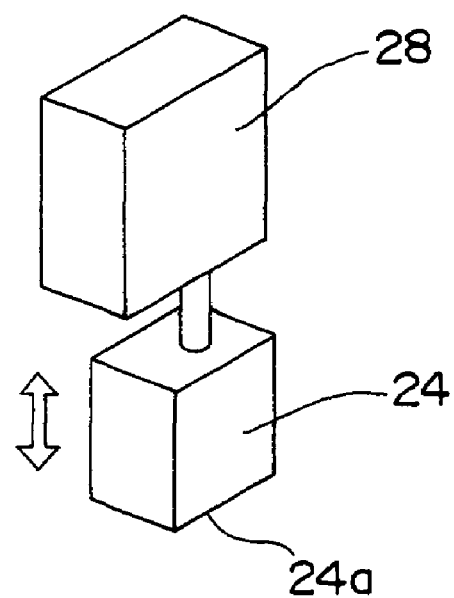
FIG. 6 is a schematic perspective view of an upper-side heatsink elevation unit.

Moreover, as shown in the schematic explanatory view of FIG. 6, the weak heat-resistant portion cooling device 22 is provided with an upper-side heatsink elevation unit 28, as one example of a cooling member moving unit for performing an elevational operation of the upper-side heatsink 24 between a height position (contact position) in which the upper-side heatsink 24 is brought into contact with the component 1 with the built-in CCD and a height position (release position) in which the contact can be released. In this upper-side heatsink elevation unit 28, the upper-side heatsink 24 can employ, for example, an air cylinder with a rotation prevention function provided with a function to prevent rotation roughly along the surface of the FPC 3 or the like.

Moreover, as shown in FIGS. 3 and 4, the lower-side heatsink 26 has a roughly rectangular-parallelepiped shape, and its upper surface serves as a contact portion 26a to be brought into contact roughly with a central portion of the lower surface of the FPC 3 placed on the stage 16. Moreover, a suction hole 30, which has a function similar to that of the suction holes 20 of the stage 16, is formed at this contact surface 26a, and the lower surface of the FPC 3 can be made to fit the contact surface 26a by suction through this suction hole 30. It is to be noted that this suction hole 30 is connected to the aforementioned vacuum suction device (not shown).

A planar external shape of the contact surface 26a of the lower-side heatsink 26 is made roughly the same as a planar external shape of the CCD 2, and the contact surface 26a of the lower-side heatsink 26 can be brought into contact with the FPC 3 so as to correspond to an arrangement position of the CCD 2 in the component 1 with the built-in CCD.

A reason why the lower-side heatsink 26 is formed as described above is that it is intended to reduce a quantity of heat caused by heating via the heating device 18, with this heat being conducted to the bonding portion 6 and the color filter 10 via the FPC 3 and the package section 4, by conducting the quantity of heat to the contact portion 26a via the FPC 3 in the neighborhood of the bonding portion 6 and the color filter 10 in consideration of the fact that the bonding portion 6, fixing the CCD 2 to the inner bottom portion 4a of the package section 4, and the color filter 10 arranged on the upper surface of the CCD 2, are the weak heat-resistant portions. Moreover, the lower-side heatsink 26 is made to closely fit the lower surface of the FPC 3 by suction of the suction hole 30, and therefore, efficiency of heat conduction as described above can be improved to allow efficient heat conduction to be achieved. Therefore, a temperature rise in the bonding portion 6 and the color filter 10 can be restrained efficiently and reliably. Moreover, in order to allow the above-mentioned function of the lower-side heatsink 26 to be efficiently achieved, the lower-side heatsink 26 is formed of, for example, aluminum or the like, which has high thermal conductivity, similarly to the upper-side heatsink 24.

Moreover, as shown in FIG. 3, a plurality of cold blast passages 31 (one example of a cooling fluid passage), through which cooling air as one example of the cooling fluid can pass, are formed in the lower-side heatsink 26. These cold blast passages 31 are connected to a cold blast supply unit (not shown), and by supplying a cold blast into the cold blast passages 31, a quantity of heat conducted to the lower-side heatsink 26 can be removed by the cold blast. Therefore, the quantity of heat can be removed by the cold blast even if the quantity of heat is conducted to the lower-side heatsink 26. Therefore, a temperature rise of the lower-side heatsink 26 can be restrained, and heat conduction can be maintained in an efficient state.

As shown in FIG. 4, the weak heat-resistant portion cooling device 22 is further provided with a lower-side heatsink moving unit 32, as one example of a moving unit for performing a movement operation of the lower-side heatsink 26 between a position (contact position) in which an approximately central portion of the lower surface of the FPC 3 is brought into contact with the lower-side heatsink 26 and a position (release position), which is located on this side in FIG. 4 with respect to the contact position, and in which this contact can be released from an inside of the stage 16. By moving the lower-side heatsink 26 so as to be inserted in the stage 16 by this lower-side heatsink moving unit 32, the heatsink can be positioned in the position in which the contact can be released. By conversely moving the heatsink so as to move it apart from the inside of the stage 16, the heatsink can be positioned in a position in which influence of heat of the stage 16 is not received. By being moved into the position located apart as described above, a quantity of heat, which has been conducted by contact with the FPC 3 and accumulated, can efficiently be radiated, so that the heatsink can be ready for heat conduction due to contact with the FPC 3 at a next time.

The lower-side heatsink 26 and the lower-side heatsink moving unit 32 as described above can be moved up and down by the stage lifter 17 together with the stage 16 and the heating device 18. The lower-side heatsink 26 positioned inside the stage 16 is to come into contact with the lower surface of the FPC 3 concurrently with placement of the lower surface of the FPC 3 on the portions of placement surface 16a of the stage 16. That is, the portions of placement surface 16a of the stage 16 and the contact surfaces 26a of the lower-side heatsink 26 are formed so as to be located at an approximately mutually equal height.

Moreover, as shown in FIG. 1, the electronic component connecting apparatus 101 is provided with a control unit 90 that controls operation of the aforementioned constituent members. This control unit 90 can perform comprehensive control by interlinking operations including a conveyance operation of each transport pallet 13 performed by the conveyance unit 14, a heating operation of the stage 16 performed by the heating device 18, an elevation operation of the stage 16 and the like performed by the stage lifter 17, an elevation operation of the upper-side heatsink 24 performed by the upper-side heatsink elevation unit 28, and a movement operation of the lower-side heatsink 26 and so on performed by the lower-side heatsink moving unit 32.

The control unit 90 has a function to control a heating temperature of the stage 16 obtained via the heating device 18 on basis of data of heating temperature profiles that have preparatorily been inputted and set. Further, heat-fusing of the solder portions 12 conforming to the preset heating temperature profiles can be performed by synthetically controlling a time of contact of each FPC 3 with the stage 16, a time of contact of the upper-side heatsink 24 with the component 1 with the built-in CCD, a time of contact of the lower-side heatsink 26 with the FPC 3 and the like on basis of the data of the heating temperature profiles as described above.

(Component Connecting Operation)

A concrete operation for mounting the component 1 with the built-in CCD onto the FPC 3 by heat-fusing the solder portions 12 on the FPC 3, on which the component 1 with the built-in CCD is mounted, and thereafter cooling and solidifying the solder portions 12 in the electronic component connecting apparatus 101, that has the aforementioned construction and functions, will be described next with reference to the schematic explanatory views shown in FIGS. 7A through 7E. It is to be noted that operations subsequently described are performed by comprehensively controlling operations described later by the control unit 90 of the electronic component connecting apparatus 101 while interlinking these operations.

Figure 7A:
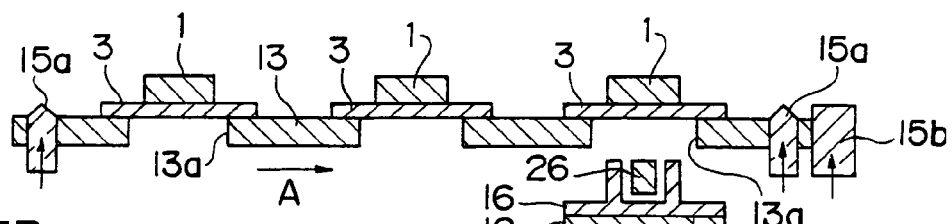

As shown in FIG. 7A, three FPC's 3 are held on the transport pallet 13, and the transport pallet 13 is conveyed along pallet conveyance direction A by the conveyance unit 14. This conveyance is stopped in a state in which one FPC 3 (the FPC 3 located at the right end in the figure) out of the FPC's 3 is positioned above the stage 16. Subsequently, the transport pallet 13 is fixed in this position by a position regulating pin 15a and stoppers 15b. It is to be noted that the stage 16 is put in a state in which it is preheated to a prescribed temperature by the heating device 18 and retained. Concurrently with this operation, the lower-side heatsink 26 positioned apart from the stage 16 by the lower-side heatsink moving unit 32 is moved so as to be inserted into the stage 16.

Figure 7B:
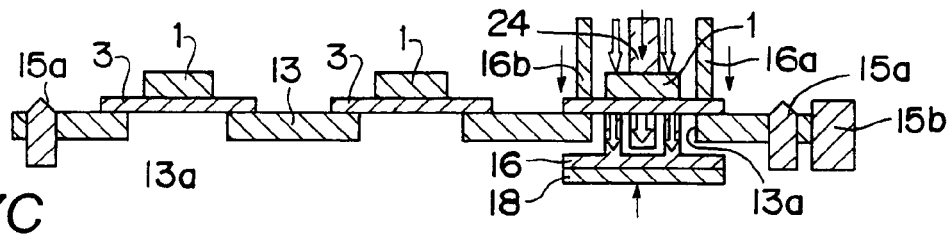

Subsequently, as shown in FIG. 7B, the heating device 18 and the lower-side heatsink 26 are integrally moved up together with the stage 16 by the stage lifter 17, and the placement surfaces 16a of the stage 16 and the contact portion 26a of the lower-side heatsink 26 are brought into contact with the lower surface of the FPC 3. Moreover, suction of the lower surface of the FPC 3 is performed by the suction holes 20 and 30 concurrently with this contact. Concurrently with this operation, the upper-side heatsink 24 positioned in the release position is moved down to the contact position by the upper-side heatsink elevation unit 28, and its contact portions 24a are brought into contact with the upper surface of the crystal cover section 5 of the component 1 with the built-in CCD. It may be a case where FPC pressurizing members 16b that pressurize and hold the upper surface end portions of the FPC 3 are moved down in synchronization with upward movement of the stage 16 by the stage lifter 17 as shown in FIG. 7B. In this case, there is an advantage in that the FPC 3, which is a film-shaped board having flexibility, can be held more reliably than when the FPC is held on the stage 16 by suction from the lower surface side.

Figure 7C:
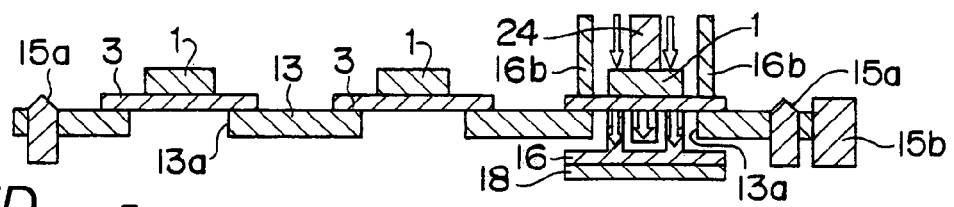

As shown in FIG. 7C, a quantity of heat is conducted from the stage 16, heated by the heating device 18, to the solder portions 12 via the FPC 3 by contact between the placement surface 16a of the stage 16 and the FPC 3, thereby starting heating of the solder portions 12. At this time, an elevated temperature of the solder portions 12 is controlled by setting a heating temperature of the stage 16 by the heating device 18 to a preset specified temperature and controlling a time of contact between the placement surface 16a of the stage 16 and the FPC 3 (i.e., controlling a time from start of contact to release of the contact).

On the other hand, the quantity of heat conducted for heating, to the solder portions 12 via the FPC 3 is conducted also to the bonding portions 6 and 9 and the color filter 10 inside the component 1 with the built-in CCD. However, due to contact between the contact portions 24a of the upper-side heatsink 24 and the end portions of the crystal cover section 5, the quantity of heat conducted to the bonding portions 9 is partially or almost totally conducted to the contact portions 24a via the crystal cover section 5. Likewise, due to contact between the contact portions 26a of the lower-side heatsink 26 and the lower surface of the FPC 3, the quantity of heat conducted to the bonding portion 6 and the color filter 10 is partially or almost totally conducted to the contact portions 26a through the neighborhood of the inner bottom portion 4a of the package section 4. By virtue of the fact that the quantity of heat conducted as described above is partially or almost totally conducted to the upper-side heatsink 24 or the lower-side heatsink 26, a temperature rise in the bonding portion 6, the bonding portions 9 and the color filter 10 can be restrained.

Figure 7D:
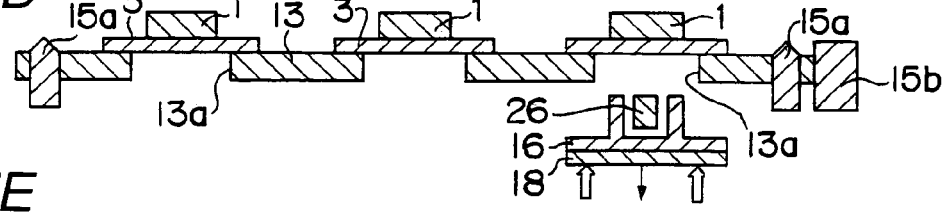

Subsequently, as shown in FIG. 7D, the solder portions 12 are raised in temperature up to their fusing point of, for example, a temperature of not lower than 215° C., maintained for a preset specified time at the temperature. Thereafter, the stage 16, the lower-side heatsink 26 and the heating device 18 are integrally moved down by the stage lifter 17 to release contact between the stage 16 and the lower-side heatsink 26 and the FPC 3. The FPC pressurizing members 16b are also moved up in accordance with this downward movement operation, thereby releasing holding of the FPC 3 on the stage 16. Further, the upper-side heatsink 24 is moved up by the upper-side heatsink elevation unit 28 concurrently with these operations, thereby releasing contact between the upper-side heatsink 24 and the crystal cover section 5.

Further, the lower-side heatsink 26 is subsequently moved to a position in which the heatsink is separated from inside of the stage 16 by the lower-side heatsink moving unit 32, thereby radiating a quantity of heat that has been conducted to and accumulated in the lower-side heatsink 26 for a next operation. Instead of a case of movement of the lower-side heatsink 26 to the position of release by the lower-side heatsink moving unit 32 as described above, it may be a case where this movement is not performed. Necessity of such movement can be determined on basis of a cooling ability of each cold blast passage 30 formed in the lower-side heatsink 26, a stand-by time until heating of a next FPC 3, and so on. It is to be noted that the heating temperature of the heating device 18 is made to remain maintained at the aforementioned constant temperature so as to be readily copable with heating of the next FPC 3.

Figure 7E:
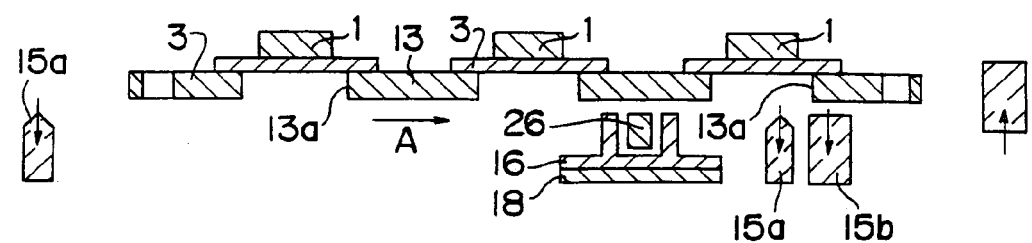

Subsequently, as shown in FIG. 7E, the positioning pin 15a and the stopper 15b, which are positioning the transport pallet 13, are moved down to release such positioning. After this release, the transport pallet 13 is conveyed along the pallet conveyance direction A by the conveyance unit 14 so that the next FPC 3 arranged adjacent is positioned above the stage 16.

Although a case has been described where the heating temperature of the heating device 18 is maintained constant according to the description of the aforementioned operation procedure, the present invention is not limited to such case. Instead of the above case, it may be, for example, a case where the heating temperature of the stage 16 by the heating device 18 is raised according to a preset condition while the stage 16 and the FPC 3 are put in contact with each other. Moreover, it may be, for example, a case where the heating temperature of the stage 16 by the heating device 18 is lowered after release of contact between the stage 16 and the FPC 3. In this case, only necessary heating can be performed when it is needed, and therefore, power consumption of the heating device 18 can be reduced. In this case, the heating temperature of the heating device 18 is raised again on basis of a specified condition by a time when the next FPC 3 is moved to and placed above the stage 16.

Figure 8A:
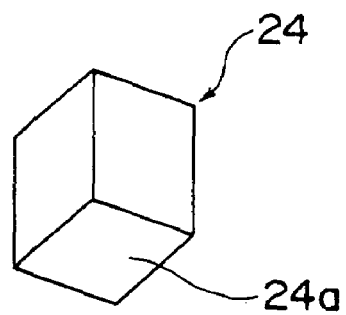

As described above, a configuration of the upper-side heatsink 24 is not limited to the configuration as shown in FIG. 5, and various configurations can be adopted. For example, as shown in FIG. 8A, it is acceptable to adopt a form such that the contact portion 24a is formed so as to closely fit an entire upper surface of the crystal cover section 5 of the component 1 with the built-in CCD by forming the lower surface of the upper-side heatsink 24 into a flat state. In a case of such form, production and processing of the upper-side heatsink 24 can be made simple.

Figure 8B:
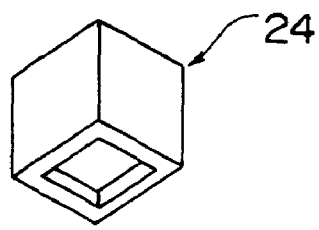

Moreover, as shown in FIG. 8B, it may be a case where the contact portion 24a of the upper-side heatsink 24 is formed into a roughly squared frame-like configuration. In this case, the contact portion 24a can be brought into contact with only the neighborhood of the bonding portions 9 from which a quantity of heat is required to be removed. Therefore, the quantity of heat can be made to effectively escape by heat conduction, and cooling of the bonding portions 9 can be performed.

Figure 8C:
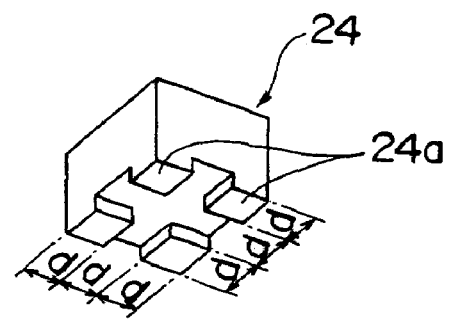

Moreover, it may be a case where the contact portions 24a are formed at four corner portions of the lower surface of the upper-side heatsink 24 as shown in FIG. 8C. In this case, the contact portions 24a can be brought into contact with the neighborhood of the four corner portions of the bonding portions 9 where a temperature can be comparatively easily raised as described above, and therefore, cooling by more effective heat conduction can be performed. It is to be noted that the contact portions 24a are each formed so as to have, for example, an approximately square plane and so that each one side dimension d becomes approximately one third of a dimension of one side of the lower surface plane of the upper-side heatsink 24.

Figure 8D:
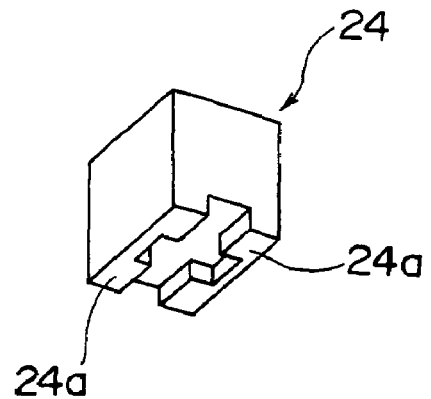

Moreover, as shown in FIG. 8D, it is also possible to provide a form of a combination of the form of FIG. 5 and the form of FIG. 8C.

Instead of a case where formation material of the contact portions 24a that have a rectangularly projected shape of the upper-side heatsink 24 and formation material of the main body of the upper-side heatsink 24 are formed of a mutually identical material, it may be a case where they are formed of mutually different materials. In this case, heat conduction from the crystal cover section 5 can be improved by using a material of higher thermal conductivity for contact portion 24a. Such material of high thermal conductivity is often a comparatively expensive material. However, in such case, the material is used only for contact portions 24a, and therefore, an increase in production cost of the upper-side heatsink 24 can be restrained. When the contact portions 24a are formed of a different material, the contact portions 24a can be formed by being bonded to the lower surface of the upper-side heatsink 24 by brazing or in a similar manner.

Figure 9:
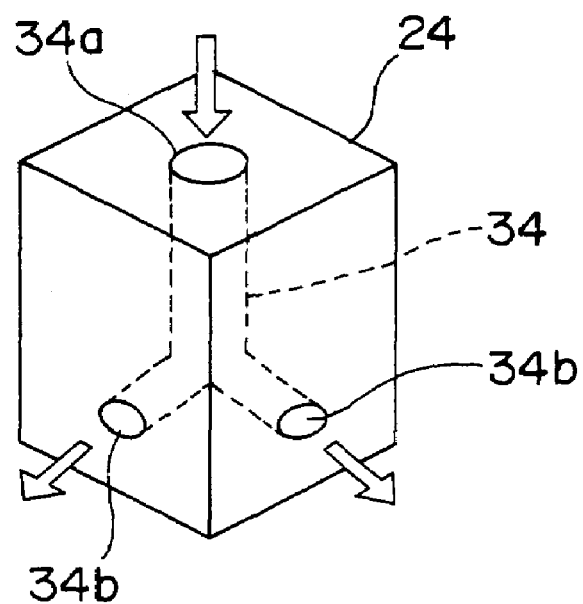
FIG. 9 is a schematic perspective view showing a cold blast passage formed through the upper-side heatsink.

Moreover, as shown in FIG. 9, it may be a case where a cold blast passage 34 (one example of a cooling fluid passage), similar to the cold blast passages 31 formed in the lower-side heatsink 26, is formed inside the upper-side heatsink 24. For example, a cold blast inlet port 34a is formed at an illustrated upper surface of the upper-side heatsink 24, cold blast outlet ports 34b are formed on illustrated side surfaces, and the cold blast passage 34 is formed so that the cold blast inlet port 34a communicates with the cold blast outlet ports 34b. Further, it is possible to connect a cold blast supply unit (not shown) to the cold blast inlet port 34a, make this supplied cold blast pass through the cold blast passage 34 to remove a quantity of heat accumulated in the upper-side heatsink 24 by this passage, and discharge the cold blast from the cold blast outlet ports 34b. At this time, since the cold blast outlet ports 34b are provided on the side surfaces of the upper-side heatsink 24, this discharged cold blast neither blows toward the component 1 with the built-in CCD nor hinders heat-fusing of the solder portions 12.

Figure 10:
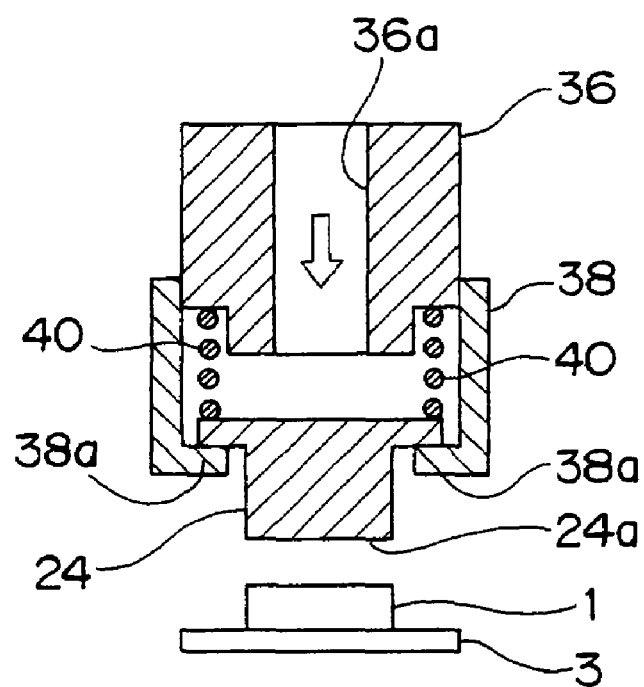
FIG. 10 is a schematic sectional view showing a construction of a follower mechanism provided for the upper-side heatsink.

Moreover, it may be a case where a follower mechanism is provided for the upper-side heatsink 24 as shown in FIG. 10. In this case, impact at a time of contact can be alleviated in bringing the contact surface 24a of the upper-side heatsink 24 into contact with the crystal cover section 5 of the component 1 with the built-in CCD that is a precision component. If the contact surface 24a and the upper surface of the crystal cover section 5 are not completely parallel to each other and slightly inclined, they can be made to closely fit each other so as to adjust a contact surface 24a side with respect to the crystal cover section 5, and efficient heat conduction can be achieved.

In concrete, as shown in FIG. 10, the upper-side heatsink 24 is provided with a guide section 38 that has a support portion 38a for supporting the upper-side heatsink 24 and slidably guides the upper-side heatsink 24 in a vertical direction along its inner surface, a spring section 40 that is one example of an elastic body provided on the upper surface of the upper-side heatsink 24, and an urging member 36 that consistently urges the upper-side heatsink 24 toward a lower side via the spring section 40. With this construction, even if the contact surface 24a of the upper-side heatsink 24 and the crystal cover section 5 are brought into contact with each other, impact of the upper-side heatsink 24 can be alleviated by the spring section 40 that serves as a buffer member. Moreover, the contact surface 24a can be freely inclined at a small angle. As shown in FIG. 10, it may be a case where a cooling passage 36a is provided inside the urging member 36 and the upper-side heatsink 24 is cooled. Moreover, it may be a case where a rubber-based material of a shock absorbing rubber or the like is employed instead of a case where the spring section 40 is employed as the elastic body.

Moreover, as another effect of providing the aforementioned follower mechanism, there is, for example, an effect that a force of mutual contact (pressurization force) between the contact surfaces 24a and the crystal cover section 5 can be approximately made uniform when the upper-side heatsink 24 has a plurality of contact surfaces 24a on its lower surface. Therefore, in this case, a state of heat conduction in portions can be approximately made uniform, and satisfactory heat conduction can be achieved.

Although the present first embodiment has been described on basis of an arrangement in which the weak heat-resistant portion cooling device 22 is provided with the upper-side heatsink 24 and the lower-side heatsink 26, the present embodiment is not limited to this case. It may be a case where either one of the upper-side heatsink 24 and the lower-side heatsink 26 is provided. For example, when quantity of heat conducted to the bonding portion 6 and the color filter 10 can be removed by cooling by use of only the upper-side heatsink 24, necessity for providing the lower-side heatsink 26 can be eliminated. Moreover, the converse case is possible. Otherwise, it can also be selectively determined whether or not each of the heatsinks is necessary depending on heat-resisting properties of materials used for the bonding portion 6, the bonding portions 9 and the color filter 10.

Moreover, the present first embodiment has been described on basis of an arrangement in which the electrode connection portions 11 are formed so that an entire lower surface of the package section 4 closely fits the upper surface of the FPC 3 in a state in which the electrode connection portions 11 formed on the lower surface of the component 1 with the built-in CCD are bonded via the electrode portions 3a formed on the upper surface of the FPC 3 and the solder portions 12. However, a form of the electrode connection portions 11 is not limited only to this case. Instead of this case, it may be, for example, a case where the electrode connection portions 11 of the component 1 with the built-in CCD are lead wires, and the lead wires are connected to the electrode portions 3a via the solder portions 12. Such lead wires are projecting from the lower surface of the package section 4. Therefore, a gap is generated between the lower surface of the package section 4 and the upper surface of the FPC 3 in the above-mentioned connected state, and this makes it possible to reduce a quantity of heat conducted to the bonding portion 6 and the color filter 10 by virtue of provision of the gap.

Moreover, by positioning the upper-side heatsink 24 in a height position of contact with the component 1 with the built-in CCD by the upper-side heatsink elevation unit 28, a placement position of the FPC 3, on which the component 1 with the built-in CCD is mounted, on the stage 16 can be retained. Using the above function can obviate a need for, for example, a suction function of the stage 16.

Moreover, instead of a case where the electronic component connecting apparatus 101, that has the aforementioned functions and construction, is constructed as a single apparatus, it may be a case where the electronic component mounting apparatus is constituted by integrating the apparatus with, for example, an electronic component placement apparatus that is one example of a component placement apparatus for placing the component 1 with the built-in CCD on the FPC 3 into one apparatus.

According to the first embodiment, the following various effects can be obtained.

First of all, instead of the arrangement in which the stage 16 on which the FPC 3 is placed for heating supports the entire lower surface of the FPC 3 in the electronic component connecting apparatus 101, the placement surface 16a can be provided partially in correspondence with arrangement positions of the solder portions 12 required to undergo heat-fusing. With this arrangement, local heating of only required portions can be performed via the placement surface 16a of the stage 16 by the heating device 18. Therefore, effective heating of the solder portions 12 can be achieved, and a quantity of heat conducted to components for which heating is not required or, for example, weak heat-resistant portions of the bonding portion 6, the bonding portions 9 and the color filter 10 can be reduced, thereby making it possible to reduce a possibility of occurrence of thermal damage to the weak heat-resistant portions.

Moreover, by virtue of provision of the suction holes 20 at the placement surface 16a of the stage 16, the lower surface of the FPC 3 placed on the stage 16 can be sucked by the suction holes 20, and the FPC 3 can be made to closely fit the placement surface 16a. Therefore, efficiency of heat conduction from the placement surface 16a to the FPC 3 can be improved, and efficient heating can be performed.

Moreover, when the solder portions 12 are heated in the aforementioned system, a quantity of heat conducted to the solder portions 12 is partially conducted to the weak heat-resistant portions of the bonding portion 6, the bonding portions 9 and the color filter 10 through the FPC 3, the electrode connection portions 11, the package section 4, and so on. However, by virtue of the arrangement in which the contact surfaces 24a of the upper-side heatsink 24 are brought into contact with the upper surface of the crystal cover section 5, and the contact surface 26a of the lower-side heatsink 26 is brought into contact with the lower surface of the FPC 3, a quantity of heat conducted can be conducted so as to escape to the heatsinks. Therefore, a temperature rise in the weak heat-resistant portions during heating of the solder portions 12 can be restrained, and occurrence of thermal damage due to this temperature rise in the weak heat-resistant portions can be restrained. Therefore, components that internally have weak heat-resistant portions like the component 1 with the built-in CCD can reliably be mounted on the FPC 3 while preventing occurrence of thermal damage to the weak heat-resistant portions.

Moreover, the contact surfaces 24a of the upper-side heatsink 24 are arranged so as to be able to come into contact with at least the four corner portions of the crystal cover section 5, and a quantity of heat, which is conducted to the bonding portions 9 that connect the four corner portions at which a temperature is easily raised by conduction of the quantity of heat, is allowed to escape more effectively to the upper-side heatsink 24. Therefore, occurrence of thermal damage to the bonding portions 9 can reliably be prevented.

Moreover, a configuration and arrangement of the contact surfaces 26a of the lower-side heatsink 26 are made to correspond approximately to a configuration and arrangement of the CCD 2 with respect to the package section 4 in the component 1 with the built-in CCD. With this arrangement, a quantity of heat conducted to the bonding portion 6 that connects the CCD 2 to the inner bottom portion 4a of the package section 4 and the color filter 10 is allowed to escape more effectively to the lower-side heatsink 26. Therefore, occurrence of thermal damage to the bonding portion 6 and the color filter 10 can reliably be prevented.

Moreover, by virtue of the arrangement in which the upper-side heatsink 24 and the lower-side heatsink 26 are locally brought into contact with the neighborhood of the weak heat-resistant portions in the component 1 with the built-in CCD, no influence is exerted on heating of the solder portions 12 that require reliable heating even if a quantity of heat is conducted to the heatsinks so as to escape, and contact portions and their neighborhoods are cooled. Therefore, local heating of required portions and local cooling of the required portions can be made compatible.

Second Embodiment

Figure 11:
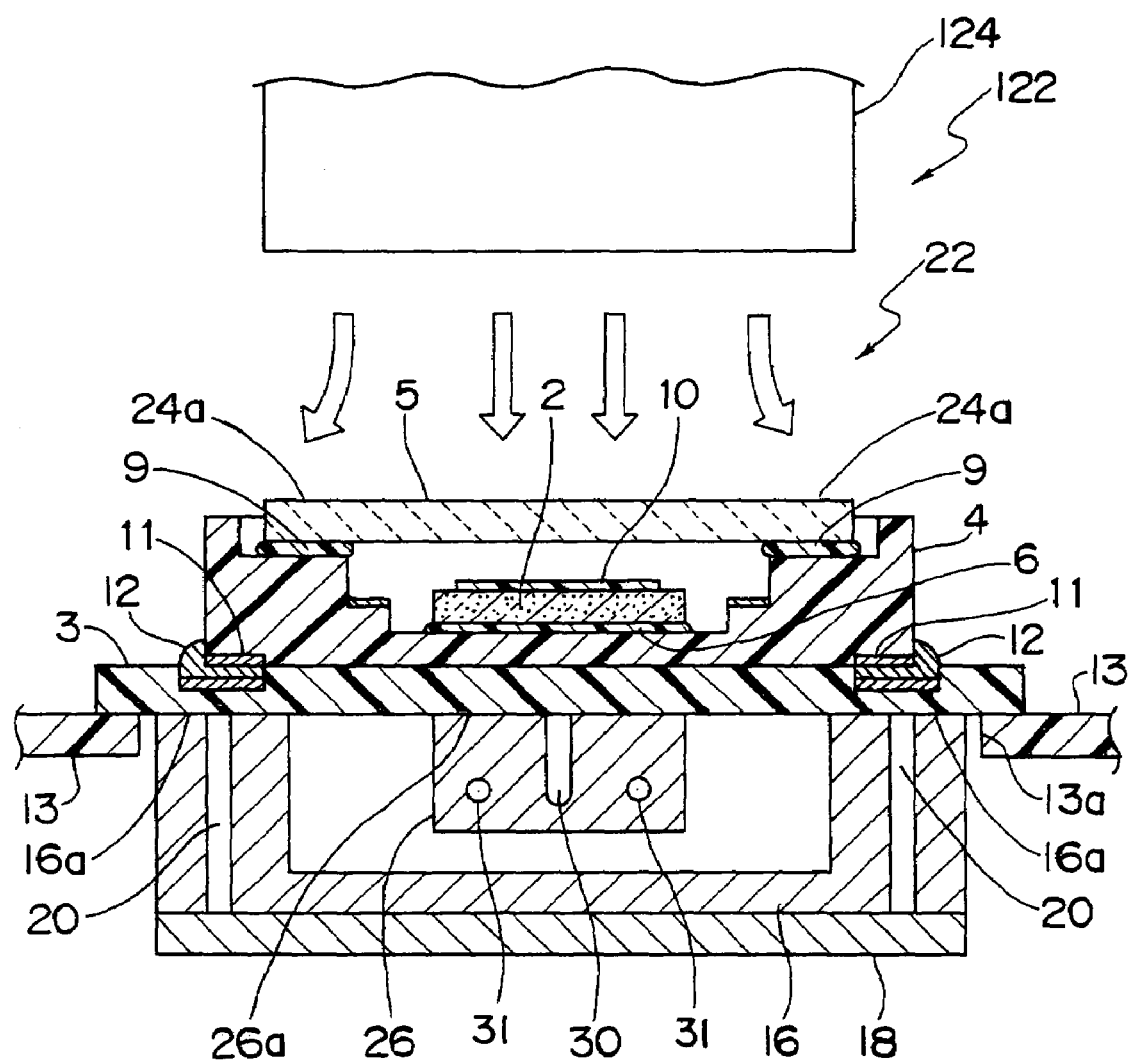
FIG. 11 is a schematic sectional view showing a state in which a connecting operation is performed for a component with a built-in CCD and an FPC in an electronic component connecting apparatus according to a second embodiment of the present invention.

The present invention is not limited to the aforementioned embodiment but allowed to be embodied in various forms. For example, the electronic component connecting apparatus of a second embodiment of the present invention is provided with a weak heat-resistant portion cooling device 122 of a construction different from that of the electronic component connecting apparatus 101 of the first embodiment. FIG. 11 shows a schematic sectional view showing a schematic construction of this weak heat-resistant portion cooling device 122. In the following description, portions having constructions similar to those of the first embodiment are denoted by same reference numerals for sake of easy understanding of the description.

As shown in FIG. 11, the weak heat-resistant portion cooling device 122 is provided with a cold blast supply nozzle 124, capable of blowing a cold blast from above component 1 with a built-in CCD, in place of the upper-side heatsink 24, although it is provided with a lower-side heatsink 26 similarly to the weak heat-resistant portion cooling device 22 of the first embodiment.

The above-mentioned cold blast supply nozzle 124 is able to blow a cold blast against principally an upper surface of crystal cover section 5 of the component 1 with the built-in CCD, and able to blow a cold blast against particularly at least four corner portions of the crystal cover section 5. The cold blast supply nozzle 124 has its formation width formed so as to be smaller than a formation width of the component 1 with the built-in CCD. This arrangement is to prevent the cold blast supplied from the cold blast supply nozzle 124 from being blown directly toward solder portions 12, so that heat-fusing of the solder portions 12 is not hindered. It is to be noted that an arrangement of the cold blast supply nozzle 124 is not limited to the above-mentioned arrangement so long as blowing of the cold blast directly toward the solder portions 12 is prevented.

As described above, the cold blast supplied from the cold blast supply nozzle 124 is blown against the crystal cover section 5, by which a quantity of heat conducted to bonding portions 9 can be removed from the surface of the crystal cover section 5 by virtue of the cold blast, and a temperature rise in the bonding portions 9 can be restrained.

It is to be noted that control of a supply operation of the cold blast by the cold blast supply nozzle 124 is executed as comprehensive control by control unit 90 while being interlinked to other operations.

A procedure of a mounting operation of the component 1 with the built-in CCD onto FPC 3 performed in the electronic component connecting apparatus that has the aforementioned construction will be described in concrete with reference to schematic explanatory views shown in FIGS. 12A through 12E. It is to be noted that operations described hereinafter are executed under comprehensive control of the control unit 90 while being interlinked to one another.

Figure 12A:
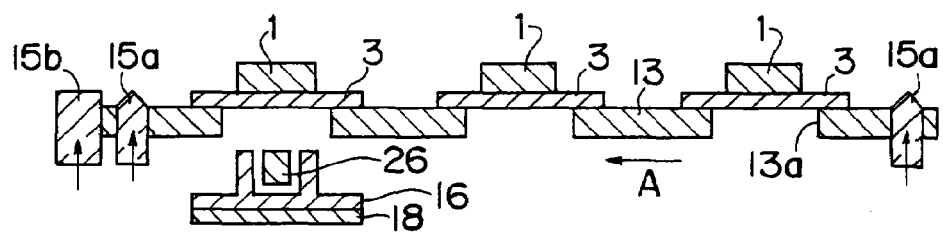

As shown in FIG. 12A, three FPC's 3 are held on transport pallet 13, and the transport pallet 13 is conveyed in pallet conveyance direction A (leftward direction in this figure) by conveyance unit 14. In a state in which one FPC 3 (the FPC 3 located at the left end in the figure) of the FPC's 3 is positioned above stage 16, conveyance is stopped. Subsequently, the transport pallet 13 is fixed in position by position regulating pins 15a and stopper 15b. It is to be noted that the stage 16 has been heated to and maintained at a preset temperature by heating device 18. Concurrently with this operation, the lower-side heatsink 26 positioned separated from stage 16 by the lower-side heatsink moving unit 32 is moved so as to be inserted into the stage 16.

Figure 12B:
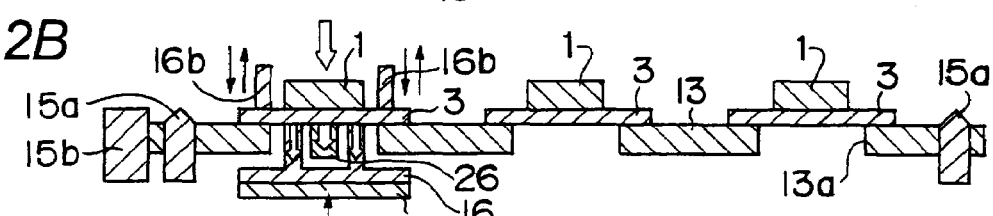

Subsequently, as shown in FIG. 12B, the heating device 18 and the lower-side heatsink 26 are integrally moved up together with the stage 16 by stage lifter 17, so that placement surface 16a of the stage 16 and contact portion 26a of the lower-side heatsink 26 are brought into contact with a lower surface of the FPC 3. Upon achieving this contact, suction of the lower surface of the FPC 3 is performed by suction holes 20 and 30. Concurrently with this operation, supply of a cold blast from the cold blast supply nozzle 124 toward an upper surface of the component 1 with the built-in CCD is started. It may be a case where FPC pressurizing members 16b that pressurize and hold upper end portions of the FPC 3 are moved down in synchronization with upward movement of the stage 16 by the stage lifter 17 as shown in FIG. 12B.

Figure 12C:
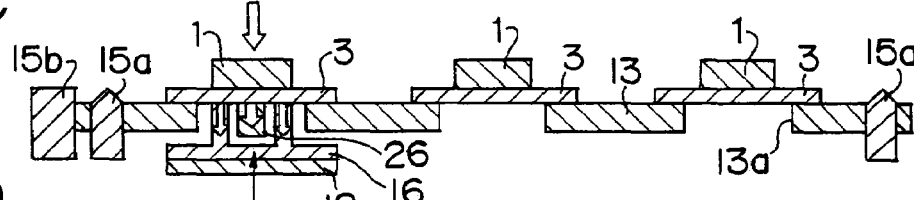

As shown in FIG. 12C, a quantity of heat is conducted from the stage 16, heated by the heating device 18, to the solder portions 12 via the FPC 3 due to contact between the placement surface 16a of the stage 16 and the FPC 3, thereby starting heating of the solder portions 12. At this time, a heating temperature of the stage 16 by the heating device 18 is made constant at a preset temperature, and control of an elevated temperature of the solder portions 12 is executed by controlling a time of contact between the placement surface 16a of the stage 16 and the FPC 3.

On the other hand, a quantity of heat conducted, for heating, to the solder portions 12 via the FPC 3 is conducted also to bonding portions 6 and 9 and the color filter 10 inside the component 1 with the built-in CCD. However, the quantity of heat conducted to the bonding portions 9 is partially or almost totally removed, by the cold blast blown, via the crystal cover section 5 by blowing of the cold blast from the cold blast supply nozzle 124. Moreover, due to the contact between the contact portions 26a of the lower-side heatsink 26 and the lower surface of the FPC 3, the quantity of heat conducted to the bonding portions 6 and the color filter 10 is partially or almost totally conducted to the contact portions 26a via the neighborhood of inner bottom portion 4a of package section 4. By thus allowing the quantity of heat-conducted partially or almost totally as described above to be cooled by the cold blast blown or heat conduction to the lower-side heatsink 26, a temperature rise in the bonding portion 6, the bonding portions 9 and the color filter 10 can be restrained.

Figure 12D:
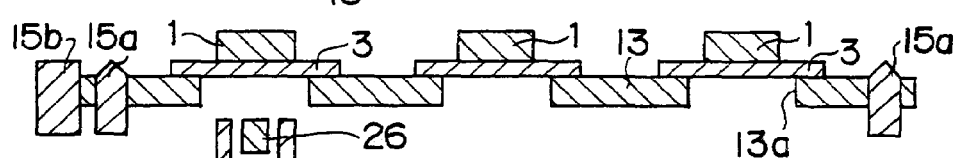

Subsequently, as shown in FIG. 12D, a temperature of the solder portions 12 is raised up to their fusing point of, for example, not lower than 215° C. and maintained at this temperature for a preset specified time. Thereafter, the stage 16, the lower-side heatsink 26 and the heating device 18 are integrally moved down by the stage lifter 17, thereby releasing contact between the stage 16 and the lower-side heatsink 26 and the FPC 3. Moreover, the FPC pressurizing members 16b are also moved up with this downward movement operation, thereby releasing holding of the FPC 3 on the stage 16. Further, supply of the cold blast from the cold blast supply nozzle 124 is stopped with these operations.

Figure 12E:
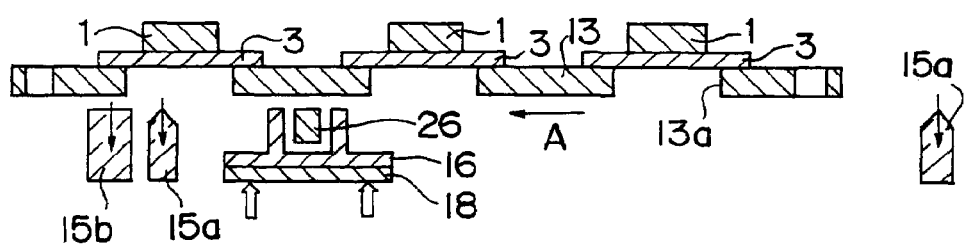

Subsequently, as shown in FIG. 12E, the positioning pins 15a and the stopper 15b, which are positioning the transport pallet 13, are moved down to release this positioning. After this release, the transport pallet 13 is conveyed in the pallet conveyance direction A by the conveyance unit 14 so that an adjacently arranged next FPC 3 is positioned above the stage 16.

According to the second embodiment, local cooling of the weak heat-resistant portions can be performed also by using the cold blast supply nozzle 124 in place of the upper-side heatsink 24 of the weak heat-resistant portion cooling device 22 of the first embodiment, and effects similar to effects of the first embodiment can be obtained.

Moreover, an arrangement in which local cooling can be performed without contact with the component 1 with the built-in CCD becomes effective particularly when it is difficult to achieve such contact. For example, it can be considered, for example, a case where the upper surface of the crystal cover section 5 has an undulated configuration or the like.

Example

Figure 13:
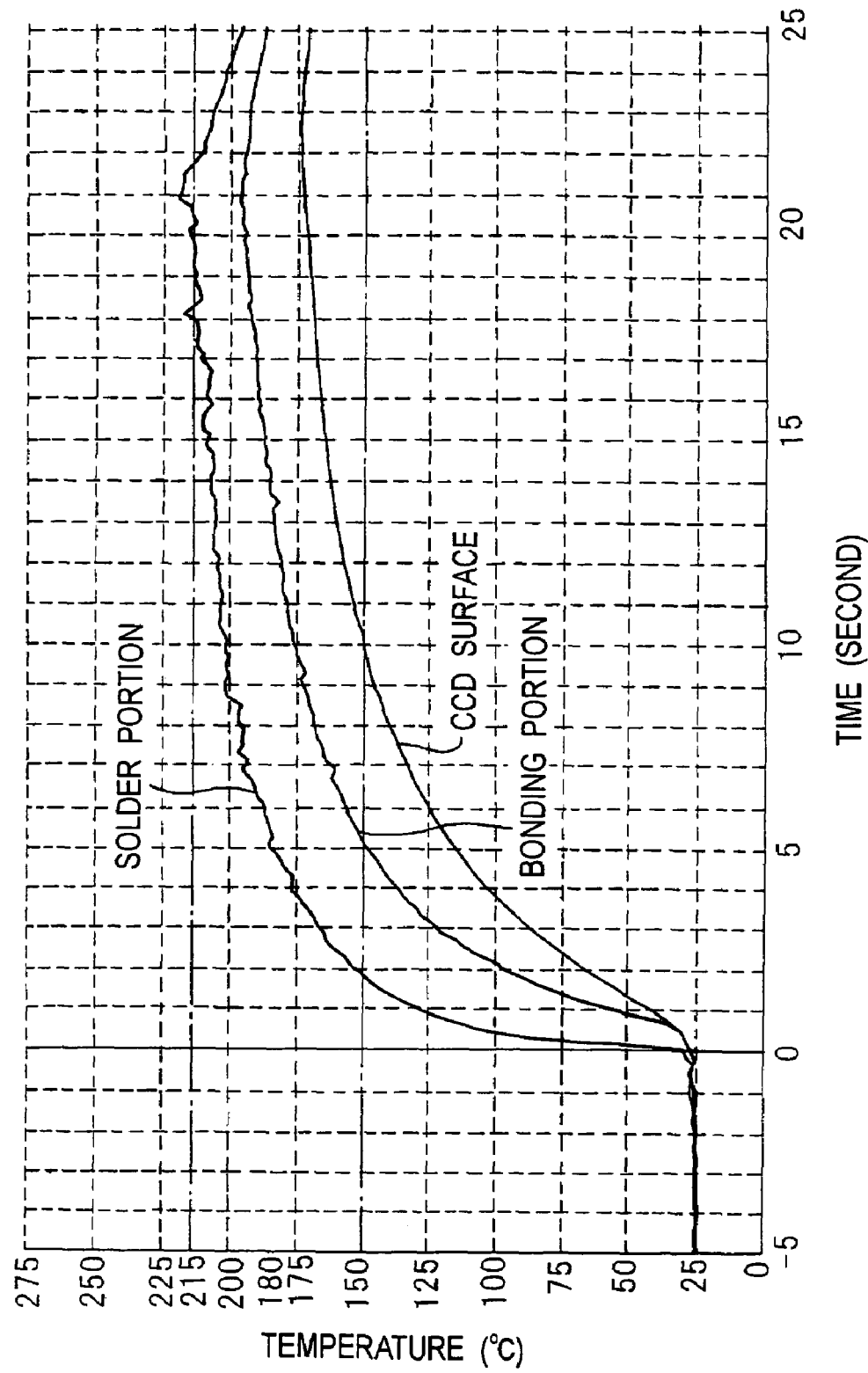
FIG. 13 is a graph showing temperature change states of a solder portion, a bonding portion and a color filter by a connection method according to an embodiment of the present invention.

Next, a state of change in the heating temperature of the solder portions 12 and a state of change in a surface temperature of the bonding portions 9 or the CCD 2, when the component 1 with the built-in CCD is mounted (connected) onto the FPC 3 by the electronic component connecting apparatus 101, are shown in FIG. 13.

In this example, heating conditions of the stage 16 by the heating device 18 include a heating temperature of 350° C. and a heating time of 20 seconds, and the upper-side heatsink 24 of the configuration shown in FIG. 8A and the lower-side heatsink 26 of the configuration shown in FIGS. 3 and 4 are provided. Moreover, a target heating temperature of the solder portions 12 is not lower than 215° C., a temperature upper limit value of an upper surface of the CCD 2 (i.e., a temperature upper limit value of the color filter 10) is not higher than 180° C., and a temperature upper limit value of the bonding portion 6 is not higher than 200° C. By performing the aforementioned connection under these conditions of the upper limits, temperature change states as shown in FIG. 13 were able to be detected. In FIG. 13, the vertical axis represents temperature (° C.), the horizontal axis represents time (seconds), and there are shown states of change in the temperature of the solder portions 12, the bonding portion 6 and the surface of the CCD 2 (hereinafter assumed to be the color filter 10).

Moreover, a time point at which the FPC 3 and the placement surface 16a of the stage 16 are brought into contact with each other is assumed to be zero seconds as a reference time.

As shown in FIG. 13, before zero seconds of the reference time (i.e., before starting heating), the temperature of the solder portions 12, the bonding portion 6 and the color filter 10 is approximately about 25° C. Subsequently, after the zero seconds, heating of the FPC 3 is started, and therefore, temperatures of the solder portions 12, the bonding portion 6 and the color filter 10 rise. At this time, the placement surface 16a are arranged so as to be adjacent to respective solder portions 12, and therefore, the temperature of the solder portions 12 can be rapidly raised. On the other hand, by virtue of the lower-side heatsink 26 brought into contact with the neighborhood of the CCD 2, i.e., the neighborhoods of the bonding portion 6 and the color filter 10, a quantity of heat conducted to the bonding portion 6 and the color filter 10 can be partially removed by being conducted to the lower-side heatsink 26. Therefore, a degree of a temperature rise in the bonding portion 6 and the color filter 10 can be restrained in comparison with a temperature rise in the solder portions 12.

Subsequently, at or about a time point of 18 seconds, the temperature of the solder portions 12 exceeds (or reaches) 215° C. (a target heating temperature), so that heat-fusing of the solder portions 12 is started. Subsequently, in an interval of 18 seconds to 20 seconds, the temperature of the solder portions 12 is put in a state in which it is maintained at about at least 215° C., so that the solder portions 12 are fused. Meanwhile, also in this interval, the temperature of the bonding portion 6 is kept not higher than 197° C. and does not exceed 200° C. of the temperature upper limit value. Likewise, in the same interval, the temperature of the color filter 10 is kept not higher than 174° C. and does not exceed 180° C. (a temperature upper limit value).

Subsequently, at a time point of 20 seconds, contact between the placement surface 16a and the FPC 3 is released, while contact between the upper-side heatsink 24 and the component 1 with the built-in CCD and contact between the lower-side heatsink 26 and the FPC 3 are further released, thereby establishing a state in which heating of the FPC 3 and cooling of the bonding portion 6 and the cooling color filter 10 concurrent with this heating is stopped. Subsequently, temperatures of the solder portions 12, the bonding portion 6 and the color filter 10 are lowered, so that the solder portions 12 in a fused state are solidified and the component 1 with the built-in CCD is connected to the FPC 3.

The above-mentioned connection method is able to rapidly heat the solder portions 12 while maintaining temperatures of the weak heat-resistant portions of the bonding portion 6 and the color filter 10 below respective upper limit values. Therefore, occurrence of thermal damage to the weak heat-resistant portions can be prevented, and time required for the connection can be reduced.

Moreover, a heating temperature profile of the solder portions 12 and heating temperature profiles of the weak heat-resistant portions of the bonding portion 6 and the color filter 10, as shown in FIG. 13, can be achieved by controlling a time of contact between the stage 16 and the FPC 3, a time of contact between the upper-side heatsink 24 and the component 1 with the built-in CCD, and a time of contact between the lower-side heatsink 26 and the FPC 3, by the control unit 90.

Third Embodiment

It is to be noted that the present invention is not limited to the aforementioned embodiments but allowed to be embodied in various forms. For example, an electronic component connecting apparatus and method capable of achieving efficient reliable heating when a board placed on a heating stage is heated by heat conduction, will be described below as a third embodiment of the present invention with reference to the drawings. In this case, an electronic component connecting method is a method performed in the aforementioned electronic component connecting apparatus. It is to be noted that same constituent portions are denoted by same reference numerals in the figures.

Figure 15:
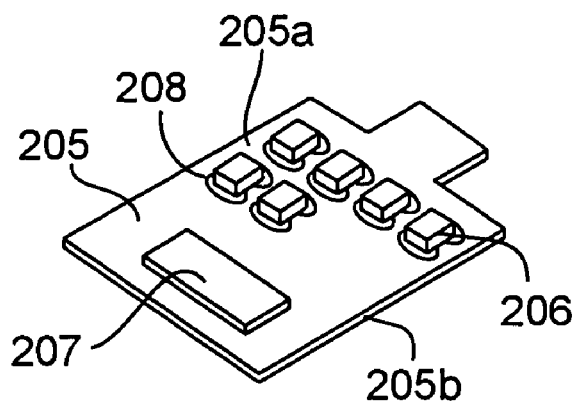
FIG. 15 is a perspective view of a circuit board suitable for heating by the electronic component connecting apparatus shown in FIG. 14.

In the following embodiments, electronic components are components that are to be surface mounted on a circuit board and connected to the circuit board by use of connection material and correspond to, for example, chip component 206 and an IC 207 as shown in FIG. 15. As the connection material, solder, i.e., solder paste is taken as an example in terms of workability in the following embodiment. However, the connection material is not limited to this but allowed to be, for example, silver paste, conductive adhesive or the like. Moreover, in the following embodiments, with regard to the circuit board, for example, a film-shaped flexible board, i.e., a FPC (Flexible Printed Circuit Board) is taken as an example of a flexible board that has flexibility. Such flexible board has features that it easily warps, thereby bending and loosening while being held due to a functional characteristic of flexibility possessed, and there are difficulties in securely holding the board. It is to be noted that the board is not limited to a flexible board like this but allowed to be, for example, a board that has a thickness of, for example, not greater than 1 mm or, for example, a thickness within a range of 0.02 mm to 1 mm. Moreover, presence or absence of flexibility does not matter. In short, objective boards are not boards of same type produced in large quantities as in a conventional case, but circuit boards of different types produced in small quantities. Moreover, the circuit board may be a tape-shaped board in which a plurality of flexible boards is continuously formed in a tape-like form. In this case, it may be either a case where boards of identical type are produced in large quantities from the tape-shaped board or a case where boards of different types are produced in small quantities.

FIGS. 14 through 17 show electronic component connecting apparatus 316 of the present third embodiment. FIG. 15 shows an FPC 205 corresponding to a circuit board to be processed by the electronic component connecting apparatus 316. The FPC 205 is, for example, a board for connecting an LCD module to a mother board, and is a single-sided mounting board. A plurality of chip components 206 besides IC 207 is put (i.e., placed) in portions to which unhardened solder paste 208 is applied on a component mounting surface 205a of the FPC 205. It is assumed that the IC 207 has been mounted on the FPC 205 before it is carried into the electronic component connecting apparatus 316 in the present embodiment.

The electronic component connecting apparatus 316 is provided with a placement member 305 on which the aforementioned FPC 205 is mounted, a heating stage 306 that heats the FPC 205 put in contact with the placement member 305 by heating the placement member 305 and thereby heat-fuses the solder paste 208 for connecting the electronic components 206 onto the FPC 205, and a pressurizing unit 300 that pressurizes the FPC 205 and the placement member 305 against the heating stage 306.

The placement member 305 has both a function to place and hold the FPC 205 and a function to conduct heat to the FPC 205, and is easily replaceable with respect to the heating stage 306 so as to be able to cope with various types of circuit boards. It is preferable that the placement member 305 has a thickness of about 0.5 mm to 5 mm and is made of a material of good thermal conductivity, such as aluminum, copper, magnesium or ceramic. Particularly, when an aluminum material having a thickness of about 2 mm is employed, this material is preferable since it is low in terms of cost and has an intended soaking property. In the present embodiment, the placement member 305 has a square shape of 35 mm×35 mm corresponding to a size of the FPC 205 to be processed. It is to be noted that the term "soaking property" means uniformity in a surface temperature distribution of an object, a temperature being changed when heat is applied to the object, and means, for example, a characteristic that has an approximately uniform temperature distribution such that the surface temperature distribution falls within a range of ±5° C.

Figure 14:
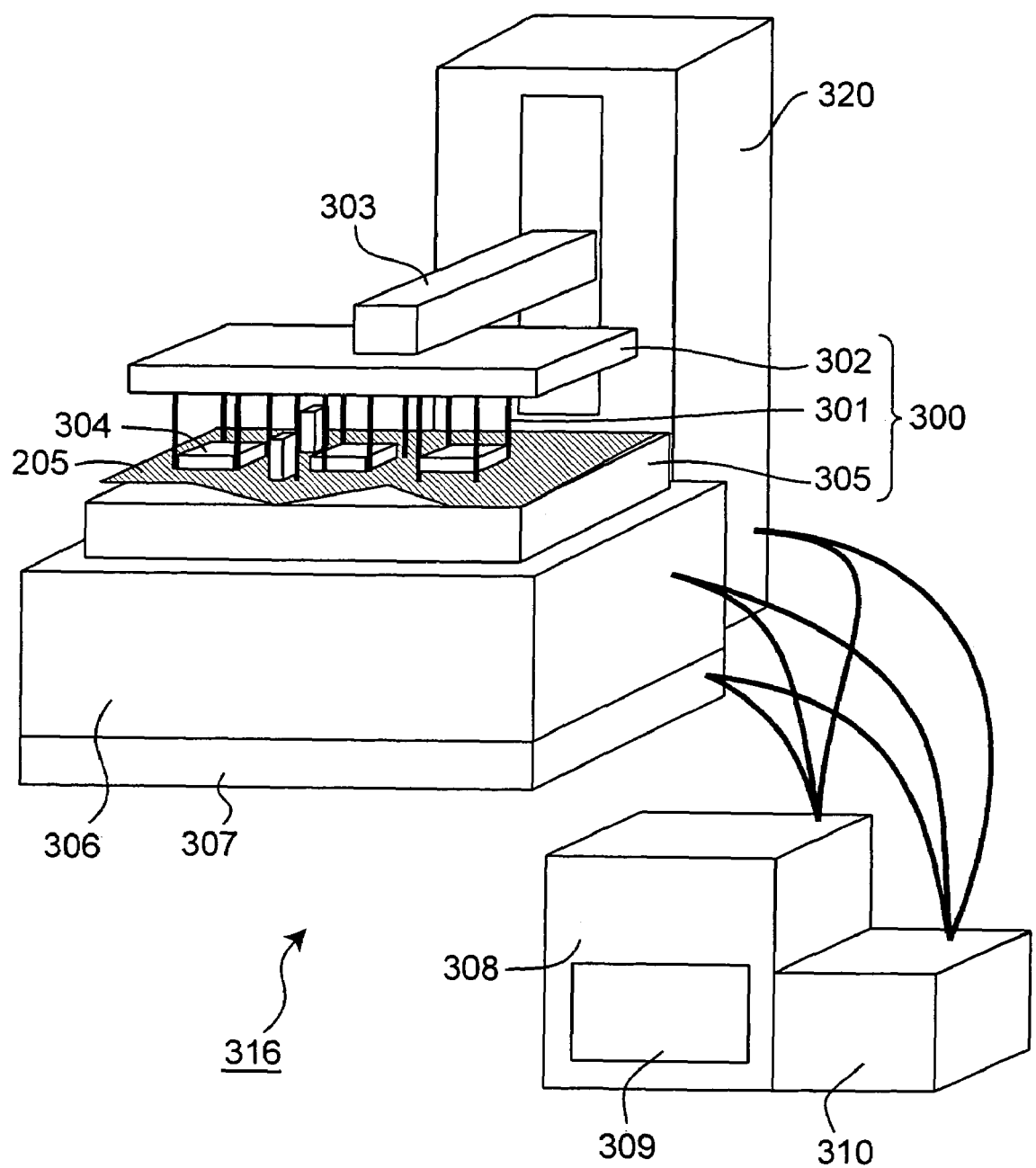
FIG. 14 is a structural schematic explanatory view of structure of an electronic component connecting apparatus according to a third embodiment of the present invention.
Figure 16:
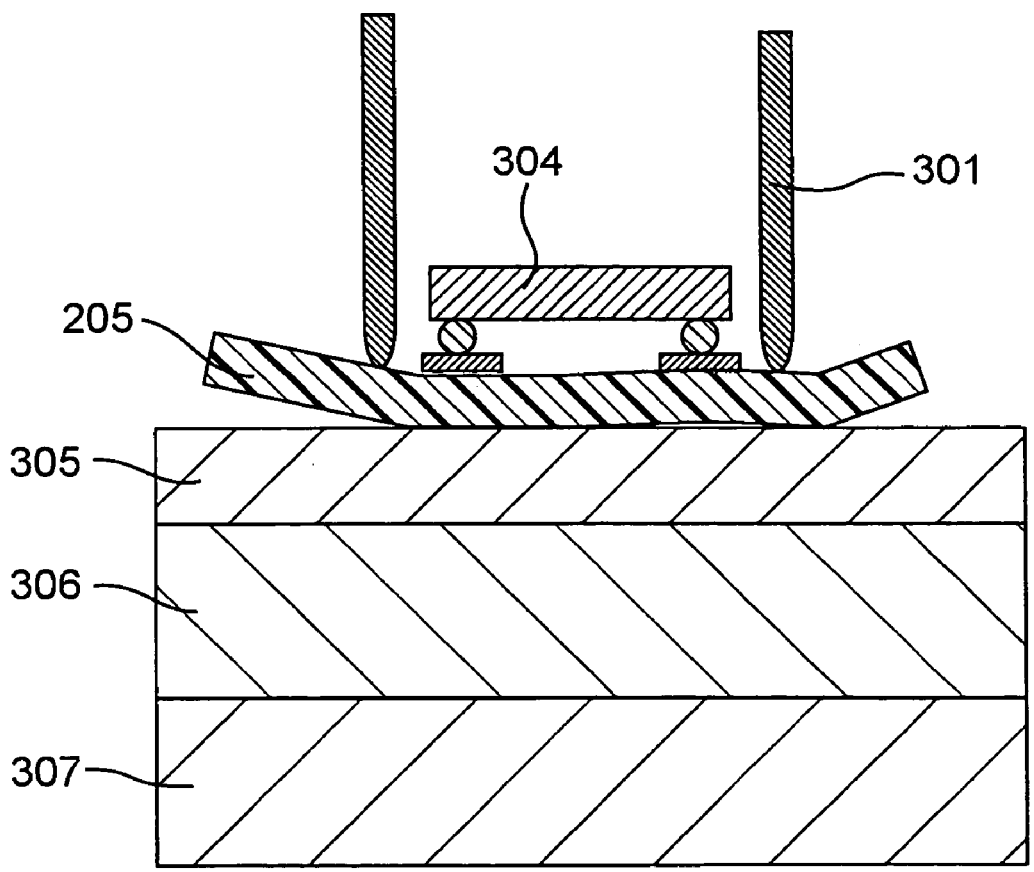
FIG. 16 is a perspective view of a placement member provided for the electronic component connecting apparatus shown in FIG. 14.

Further, as shown in FIG. 16 that is an enlarged view of FIG. 14, the pressurizing unit 300 pressurizes the FPC 205 and the placement member 305 against the heating stage 306 with needles 301 provided therefor. A plurality of needles 301 is arranged so as to depress peripheral portions of component 304 on the FPC 205 as shown in FIG. 16 in the present embodiment, and a number and positions of the needles 301 are determined in correspondence with a circuit board to be held. For example, it is sometimes a case where the needles are provided in only four places of a peripheral portion of the FPC 205. The needles 301 are fixed on a lower surface of a pressurizing plate 302. Further, by moving down the pressurizing plate 302 by use of an arm 303, it is possible to move down the needles 301 and pressurize the FPC 205. The heating stage 306, which is a heating mechanism, is provided under the placement member 305.

By moving down the arm 303 by a pressurizing mechanism 320, it becomes possible to apply an appropriate pressure capable of reliably pressurizing the FPC 205 without damaging the FPC 205 and various patterns on the FPC 205 by the needles 301. Moreover, it is acceptable to place a weight, in place of the arm 303, on the pressurizing plate 302. When a weight is employed, there are effects that a mechanism and control becomes simple and a space becomes reduced.

The heating stage 306 is provided with a cooling stage 307 and a power supply 310, and the placement member 305 is placed on this heating stage 306.

Moreover, the heating stage 306 is constructed of a so-called ceramic heater and is able to generate heat by supplying a current to a heater wire of the ceramic heater from the power supply 310. In a case of a so-called constant heat heater, other than the ceramic heater, it takes tens of seconds to several minutes in terms of response characteristics of temperature rise and fall, and this leads to poor productivity and practicability. However, the ceramic heater is able to respond within one second, and it becomes possible to set a temperature profile as follows. This heating method is not limited to such heater, and various methods can be adopted.

A temperature of the heating stage 306 is measured by a temperature sensor or, for example, a thermocouple provided in the heating stage 306 and transmitted to a control unit 308. The power supply 310 is connected to the control unit 308, and the control unit 308 controls the temperature of the heating stage 306 in a feedback manner on basis of temperature information supplied from the thermocouple and a temperature profile preset for temperature control of the circuit board.

Figure 17:
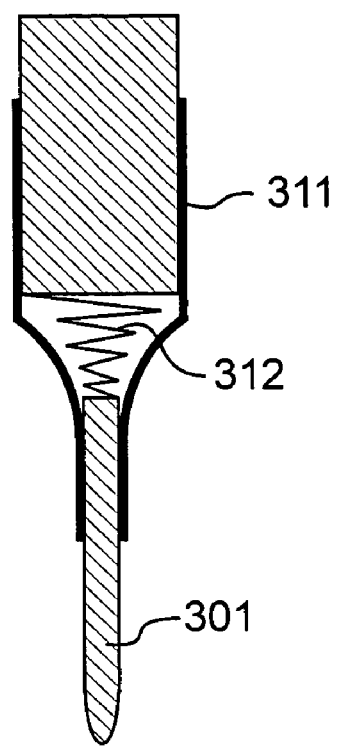
FIG. 17 is a perspective view of a needle provided for the electronic component connecting apparatus shown in FIG. 14.

Next, a detailed structure of needle 301 is shown in FIG. 17. The needle 301 is supported by a holder 311 with interposition of an elastic spring 312 together with this spring 312. The spring 312 is arranged so as to contract when a tip of the needle 301 is brought into contact with the FPC 205 arranged below the tip, and has a function to uniformly adjust a pressurization force for depressing the FPC 205 by the needle 301. Moreover, it is preferable that a spring constant of the spring 112 is selected so as not to damage the FPC 205. It may be a case where an elastic body having another form is employed in place of the spring employed as described above. Moreover, an arrangement of the needles 301 is determined according to an arrangement of components 304 on the FPC 205. That is, the arrangement of the needles 301 is determined so that a surface of the FPC 205 around peripheries of the components 304 mounted on the FPC 205 can be depressed. Moreover, the arrangement of the needles 301 is set so as not to come into contact with solder and bonding material located at connection portions of the FPC 205 and the components 304.

Moreover, it is preferable to arrange a heat insulating material at the tip portion of each needle 301, or arrange a protection sheet between the two, so that a quantity of heat conducted from heated FPC 205 to the needles 301 due to contact between the needles 301 and the FPC 205 can be reduced. Otherwise, it may be a case where a heat insulating material is arranged so that the quantity of heat is not conducted between the needles 301 and the pressurizing plate 302. By reducing a quantity of heat conducted as described above, it becomes possible to reliably efficiently perform heating of the FPC 205. As such heat insulating material, a heat-resistant material of silicone rubber or fluorine-based rubber can be utilized. Particularly, the fluorine-based material has an advantage in that it is scarcely contaminated. However, it is required to regularly replace or clean this material. It is also acceptable to cover an entire surface of the FPC 205 with a thin sheet-shaped object and pressurize the sheet with the pressurizing unit 300. In this case, by replacing this thin sheet every time or after every prescribed times of use, a problem of cleaning is eliminated. Moreover, if the pressurizing unit 300 is made replaceable and cleaned after replacement, the unit can be repetitively used. Cleaning may be achieved by either a roller type or an ultrasonic cleaning machine. Cleaning may be achieved by a mechanism that is not replaced.

Figure 18:
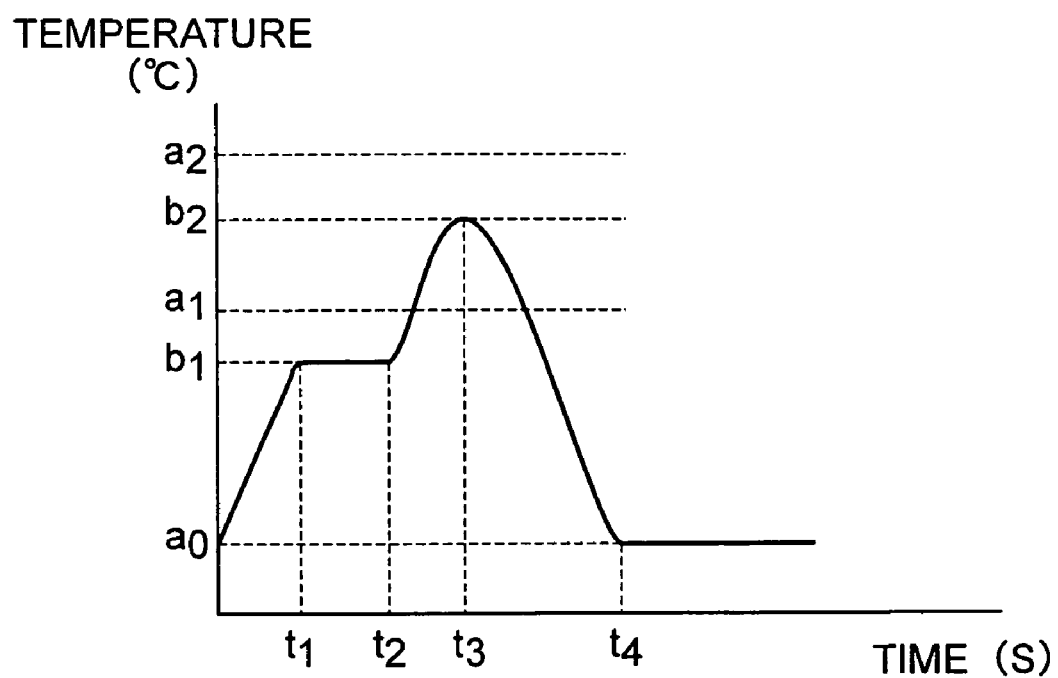
FIG. 18 is a graph showing one example of a temperature profile used for temperature control executed by the electronic component connecting apparatus shown in FIG. 14.
Figure 19:
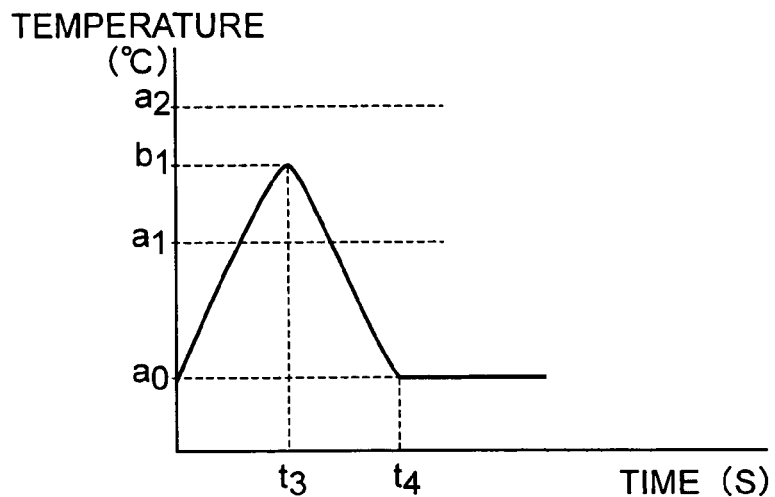
FIG. 19 is a graph showing another example of the temperature profile used for temperature control executed by the electronic component connecting apparatus shown in FIG. 14.
Figure 20:
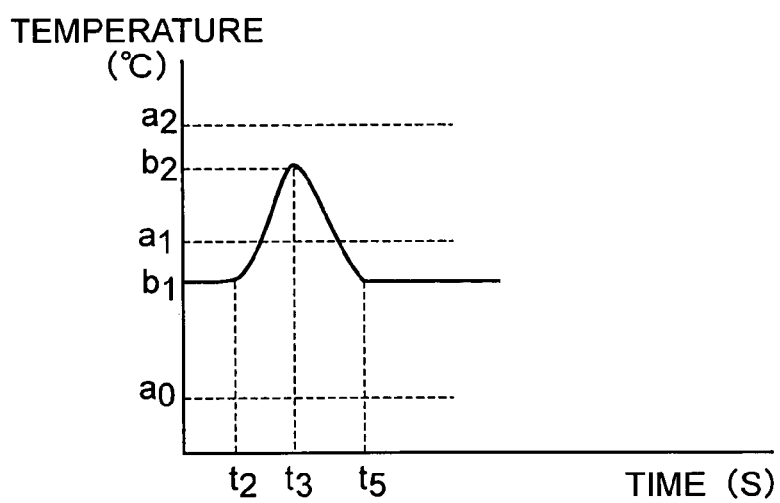
FIG. 20 is a graph showing yet another example of the temperature profile used for temperature control executed by the electronic component connecting apparatus shown in FIG. 14.

Further, the cooling stage 307 is provided under the heating stage 306 so that the heating stage 306 can be compulsorily cooled to execute temperature control conforming to temperature profiles shown in FIGS. 18 through 20. A cooling method may be either water cooling or air cooling. Otherwise, it may be a case where the heating stage 306 and the cooling stage 307 are separated from each other during heating so that the cooling stage 307 does not hinder heating by the heating stage 306, and they are brought into contact with each other during cooling.

The pressuring unit 300, the heating stage 306 and the cooling stage 307 are connected to the control unit 308, and control is performed by interlinking their operations.

Moreover, with regard to the aforementioned temperature profiles, the temperature profiles as shown in FIGS. 18 through 20 can be considered. An optimum temperature profile is selected in accordance with parameters of, for example, a type of connection material, a type and number of electronic components to be connected onto a circuit board and material, thickness and the like of the circuit board. As a selection method, there can be adopted any method that can be considered by those skilled in the art, such as a method for preparatorily storing various temperature profiles in correspondence with parameters in a storage section 309 inside the control unit 308, and inputting information of the circuit board and the electronic components to be processed and automatically extracting the optimum temperature profile by the control unit 308 or inputting a temperature profile selected by an operator.

Moreover, in the graphs of the temperature profiles shown in FIGS. 18 through 20, the vertical axis represents temperature, and the horizontal axis represents time. As for values in the graphs, according to one example, a0 is room temperature, a1 is a fusing point at 183° C. of connection material since the connection material is eutectic solder in the present embodiment, a2 is 230° C., b1 is 150° C., b2 is 220° C., t1 is one second, t2 is three seconds, t3 is four seconds, t4 is ten seconds and t5 is six seconds.

Particularly, if there are limitations on heating temperatures of electronic components 206 and 207, it is proper to assume that a heating temperature to be restricted is a2 and set a heating upper limit temperature b2 lower than a2. Moreover, the FPC 205 is heated from only back surface 205b on which no component is mounted, and therefore, the electronic components 206 and 207 are lastly heated. This aspect is also effective when there is restriction of heating.

Moreover, when it is required to restrain generation of solder balls when solder is fused, it is appropriate to provide a preheating operation to maintain a temperature from time t1 to time t2 as shown in FIG. 18. On the other hand, when an electronic component is comparatively large and influence of solder balls can be ignored, it is acceptable to provide no preheating operation and fuse solder at a stroke as shown in FIG. 19. Moreover, if it is desired to reduce time required for fusing of solder and connection of an electronic component to a circuit board, a method for starting heating preparatorily from preheating temperature b1 and maintaining the temperature b1 also after an end of connection with solder, as shown in FIG. 20, is also possible.

An operation of the electronic component connecting apparatus 316 constructed as above, i.e., an electronic component connecting method will be described below. This electronic component connecting method, i.e., a reflow method is a method particularly effective for a circuit board that has a small thickness and suitable for a board that has a thickness of not greater than 1 mm as a reference. Particularly, a film-shaped circuit board, i.e., FPC 205 has good followability to temperature control and is more effective as in the present embodiment. As material of the circuit board, glass epoxy resin and paper phenol resin are preferable in a case of a circuit board that has a thickness of not greater than 1 mm, and polyimide is preferable for use in the film-shaped circuit board. This is because polyimide has both strength and a heat-resisting property when used for a very thin circuit board that has a thickness of about 0.01 to 0.1 mm.

First of all, the placement member 305, on which the circuit board, i.e., the FPC 205 in this example, is placed, is placed on the heating stage 306. Then, the pressurizing unit 300 is operated to depress the placement member 305 against the heating stage 306 via the pressurizing unit 300 and make the placement member 305 closely fit the heating stage 306 for fixation. A pressure for the close-fit fixation of this FPC 205 should preferably be a pressurization force of a degree such that the FPC 205 is not damaged. As a result, the placement member 305 closely fits the heating stage 306, and the FPC 205 is held closely fitting a surface of the placement member 305, so that heat of the heating stage 306 is efficiently conducted to the FPC 205. A heating operation performed by the heating stage 306 is controlled by the control unit 308 in accordance with the aforementioned temperature profile, and solder 208 fuses, so that the electronic component 206 is connected onto the FPC 205 via the solder. After this connection, operation of the pressurizing unit 300 is stopped to stop pressurization, and the FPC 205 is unloaded from the placement member 305.

According to the aforementioned electronic component connecting apparatus 316, the circuit board is brought into contact with the placement member 305 that has the same size as that of one circuit board to be heated and heated by the heating stage 306, generation of loss can be reduced with respect to a small-size circuit board, and heating corresponding to various types of circuit boards can be individually performed. Therefore, circuit boards of diversified small-lot production can be manufactured with higher productivity than in a conventional case.

Concretely, in contrast to the conventional case where a power of about 20 kW has been needed as unit energy per prescribed amount of circuit boards required for heating in a conventional reflow furnace, the unit energy can be reduced to about 1 kW in the electronic component connecting apparatus 316 of the third embodiment.

Moreover, the arrangement in which the circuit board is brought into contact with the placement member 305 that has the same size as that of one circuit board to be heated, and heated by the heating stage 306, obviates a need for a reflow device of an atmosphere circulation type as in the conventional case. Then, in a case where a FPC 205 that has a size of, for example, 35 mm×35 mm is used, each electronic component connecting apparatus 316 can be constructed with a size of, for example, 35 mm×35 mm. Therefore, a heating connection device for a circuit board very compact in comparison with a conventional one can be provided.

Figure 21:
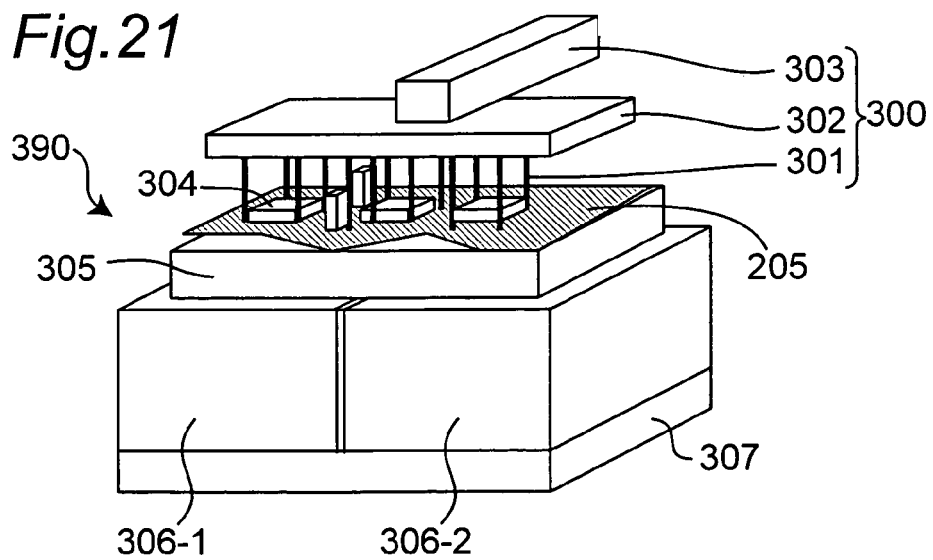
FIG. 21 is a perspective view showing a modification example of the electronic component connecting apparatus shown in FIG. 14.

Moreover, in the electronic component connecting apparatus 316 of the third embodiment, one FPC 205 is placed on the surface of the placement member 305, and a size of the placement member 305 is equal to or slightly larger than a size of the FPC 205. However, a size of the circuit board corresponding to the placement member 305 is not limited to the example of the third embodiment as described above. For example, in an electronic component connecting apparatus 390 as shown in FIG. 21, it is acceptable to provide two heating stages 306-1 and 306-2 arranged parallel in a sidewise direction and place one circuit board on placement member 305 arranged on their upper surfaces. Moreover, a direction of parallel arrangement is not limited to the above-mentioned sidewise direction, but is allowed to be directed in a longitudinal direction or both the sidewise direction and the longitudinal direction. It is also acceptable to arrange a plurality of placement members 305 and place a plurality of FPC's 205 on their surfaces.

With the above-mentioned construction, it becomes possible to adopt the electronic component connecting apparatus 316 of the present embodiment regardless of a size of the circuit board. Moreover, in view of the current situation that there exists comparatively few large-scale ceramic heaters and a development cost of a large-scale ceramic heater is huge, the above-mentioned parallel arrangement structure is effective.

Moreover, by adopting the above-mentioned parallel arrangement structure, it becomes possible to execute one heating control of an entire area in a heating region of one circuit board or execute different heating control operations in a plurality of places in the heating region of one circuit board, thereby acquiring further versatility.

Figure 22:
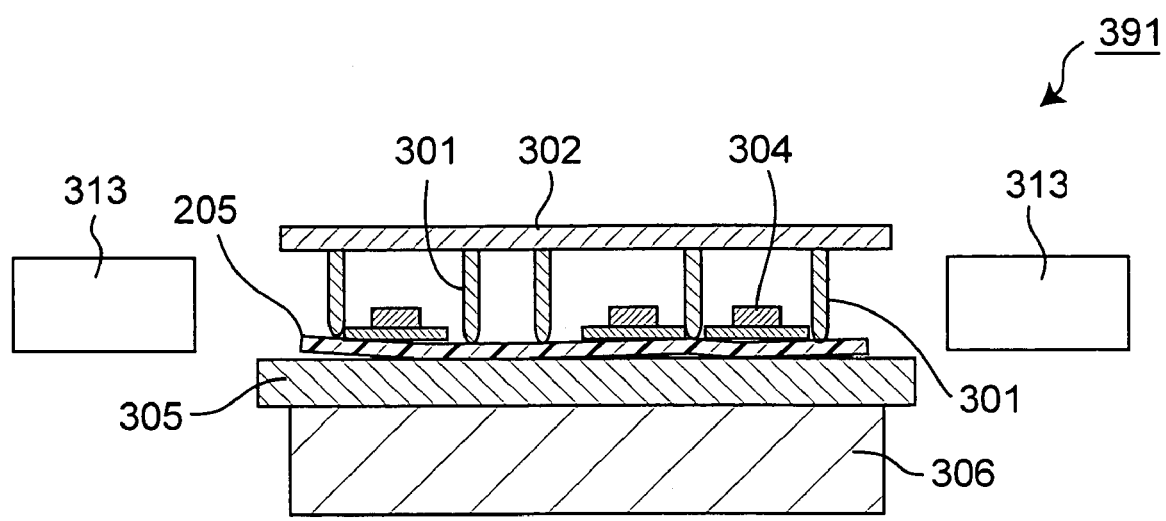
FIG. 22 is a schematic view showing another modification example of the electronic component connecting apparatus shown in FIG. 14.
Figure 23:
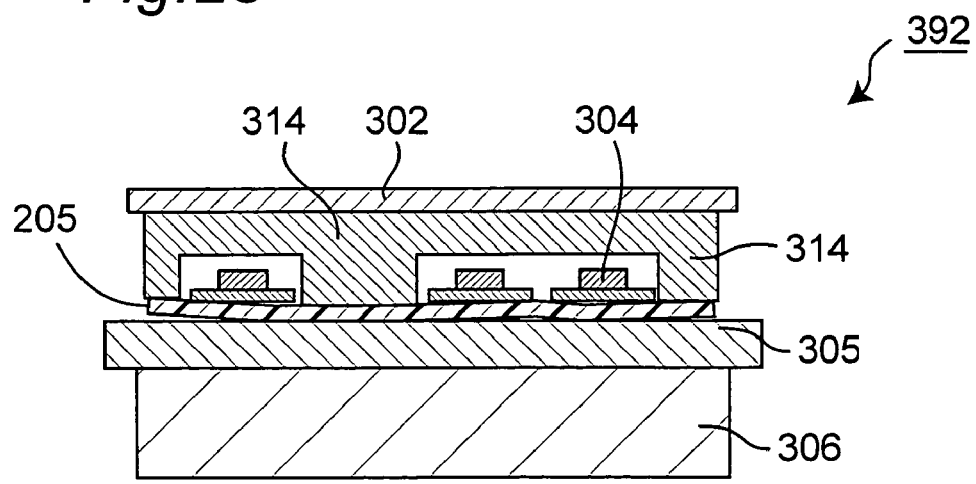
FIG. 23 is a view showing yet another modification example of the electronic component connecting apparatus shown in FIG. 14.

Furthermore, when it is required to more locally change a heating condition of a circuit board, it is possible to provide a construction in which a light beam, laser light or hot air is applied from heat sources 313 arranged on sides of the FPC 205 as in electronic component connecting apparatus 391 shown in FIG. 22. In FIGS. 21, 22 and 23, illustrated power supply 310, pressurizing unit 300, heating stage 306, cooling stage 307 and control unit 308 are similar to those of FIG. 14, and they are partially not shown.

Furthermore, it is acceptable to depress FPC 205 by a mold 314 in place of needles in an electronic component connecting apparatus 392 as shown in FIG. 23. With regard to this mold 314, configured portions are formed on its lower surface, and these configured portions are formed in conformity to a pattern of FPC 205, i.e., an arrangement of components 304, thereby making it possible to depress an upper surface of the FPC 205 on which no component 304 or the like is mounted by protruding portions of the configured portions. A material of, for example, silicone rubber having a heat insulating property is employed for portions where the mold 314 and the FPC 205 are brought into contact with each other, so that heat does not escape from a surface of the FPC 205. Moreover, the heat insulating effect can be further improved if an interior of the mold 314 is formed of a hollow in a vacuum, and this arrangement is more preferable. Moreover, it is acceptable to heat the FPC 205 from its upper surface by employing a heater inside the mold 314. In this case, there is a feature that setting of temperatures different between the upper surface and the lower surface of the FPC 205 can be achieved. However, it is preferable to provide a path that can let a generated gas component escape.

Figure 24A:
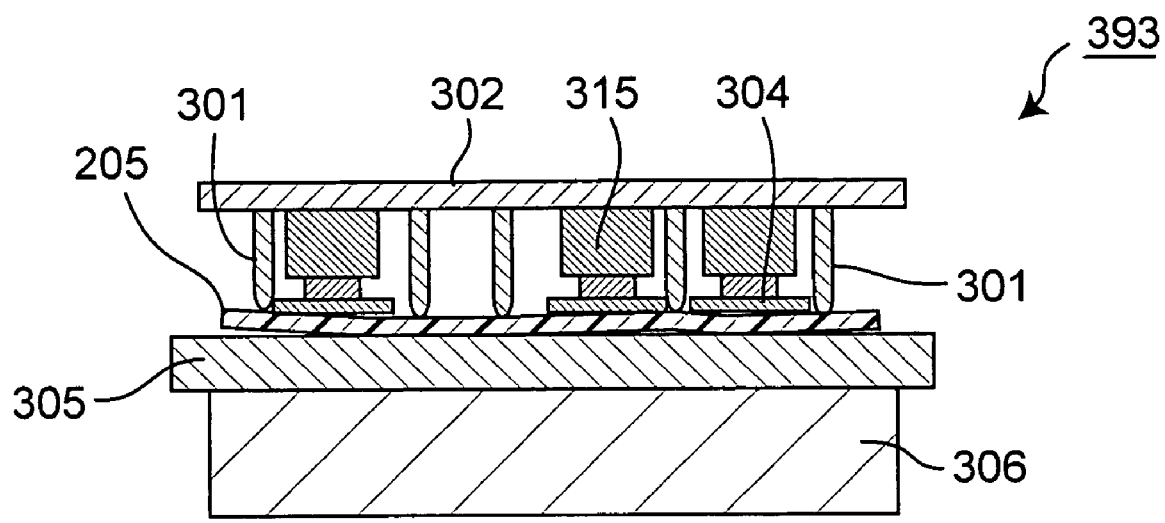

Furthermore, both FPC 205 and the components 304 can also be depressed by use of needles 301 and pressurizing members 315 in an electronic component connecting apparatus 393 as shown in FIG. 24A. This arrangement is effective for a board of which a component mounting density on the FPC 205 is increased in comparison with the cases of FIGS. 22 and 23. There is no place where each needle 301 directly depresses the FPC 205, and the components 304 are depressed. Moreover, when component 304 has a poor heat-resisting property, the pressurizing member 315 may be brought into contact with the component in order to deprive a portion from heat. As a connection method of a component that has such a poor heat-resisting property, the connection method described in connection with the first embodiment and the second embodiment can be adopted.

Figure 24B:
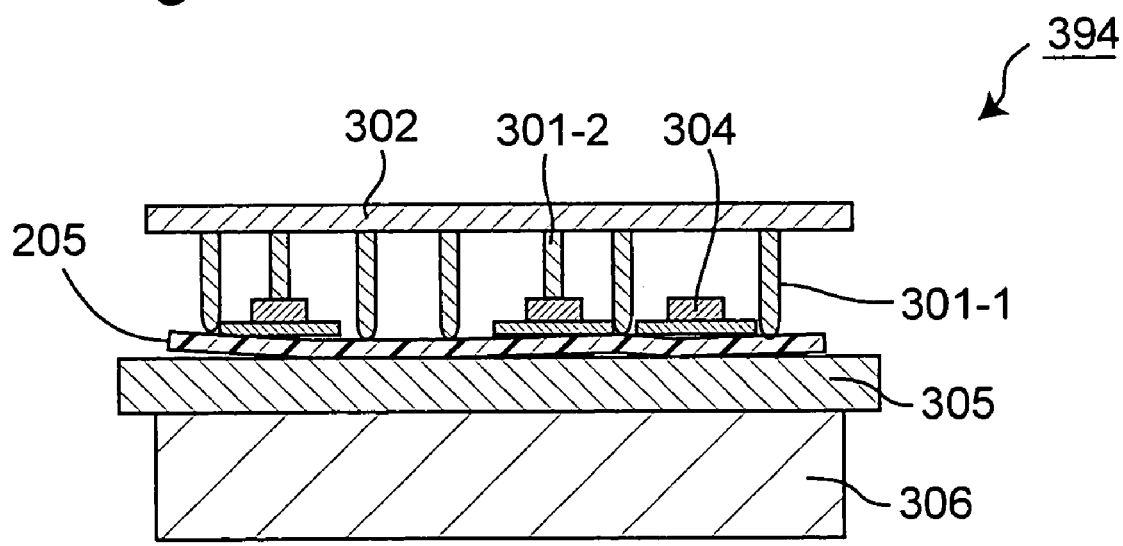

As another modification example, it is possible to employ two types of needles 301-1 and 301-2 of which lower tips have mutually different height positions, depress a surface where no component 304 is arranged on FPC 205 by use of the needles 301-1 and depress components 304 by use of the needles 301-2 in an electronic component connecting apparatus 394 as shown in FIG. 24B. In this case, an arrangement and heights of the needles 301-1 and needles 301-2 are required to be adjusted to an arrangement of the components 304 mounted on the FPC 205. In accordance with an increase in a mounting density of the components 304 and the like on the FPC 205, this kind of method is effective.

Fourth Embodiment

Figure 26:
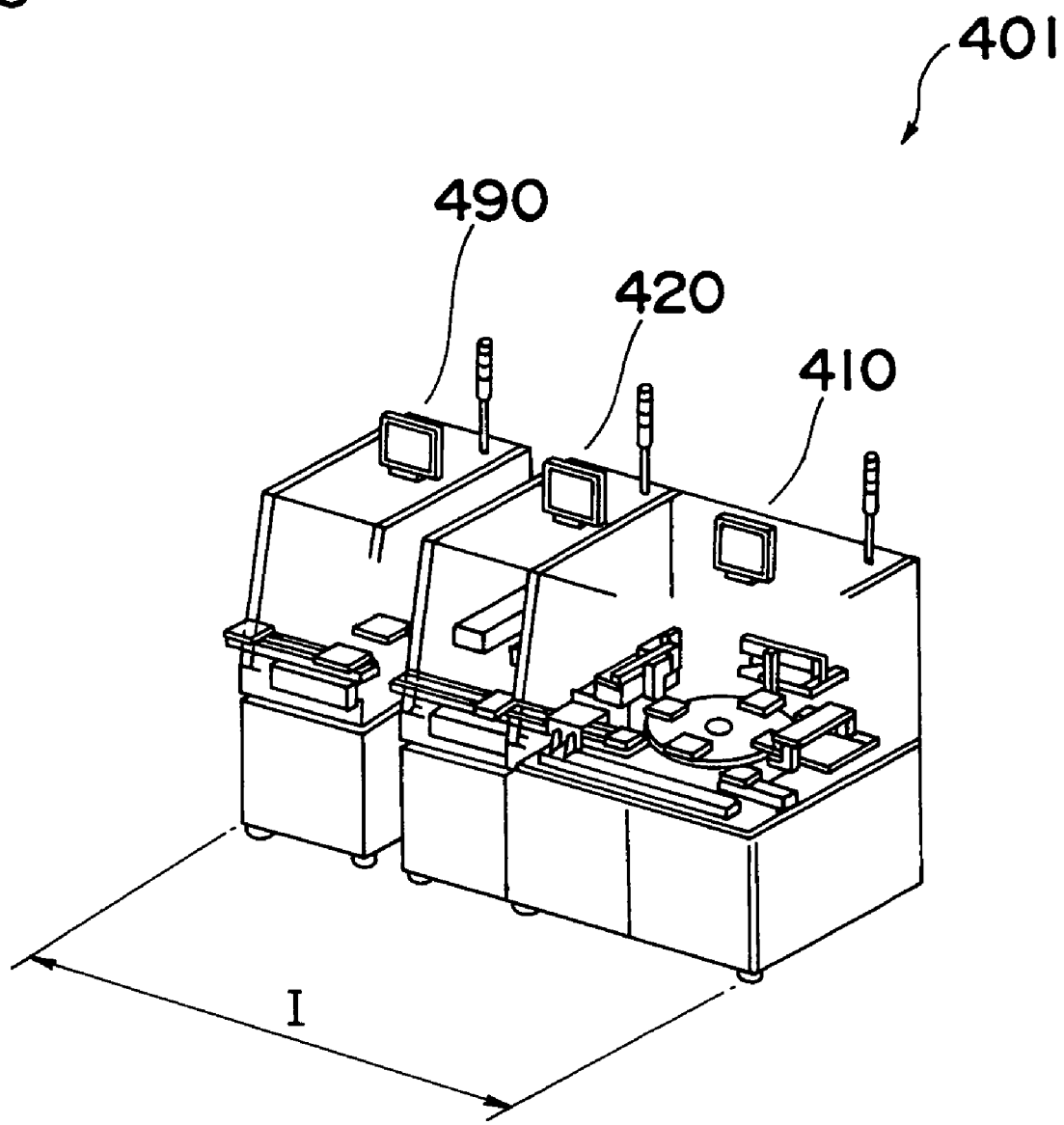
FIG. 26 is a schematic view showing another mounting system into which the electronic component connecting apparatus shown in FIG. 21 is incorporated.

An electronic component mounting apparatus (also referred to as a "mounting system") employing an electronic component connecting apparatus 490 that has the construction and the function of the electronic component connecting apparatus 316 of the third embodiment will be described next as an electronic component mounting apparatus according to a fourth embodiment of the present invention. A schematic view showing a construction of mounting system 401 of the present fourth embodiment is shown in FIG. 26. It is to be noted that FPC 205 is taken as one example of a circuit board.

As shown in FIG. 26, the mounting system 401 is provided with a solder feeding apparatus 410 for applying solder paste 208 to the FPC 205, a component placement apparatus 420 that is one example of an electronic component placement apparatus for placing chip components 206 on the FPC 205, and the electronic component connecting apparatus 490 for fusing the solder paste 208 and connecting chip components 206 to the FPC 205, which are arranged so that each FPC 205 is conveyed to the solder feeding apparatus 410, the component placing apparatus 420 and the electronic component connecting apparatus 490 in this order. It is to be noted that each FPC 205 on which IC 207 has been preparatorily mounted is fed to the solder feeding apparatus 410. The solder feeding apparatus 410 may have a construction of either a solder printer or a solder dispenser.

Moreover, as described in connection with the electronic component connecting apparatus 316 of the third embodiment, the electronic component connecting apparatus 490 that has an approximately similar construction and functions is constructed so as to pressurize a board on a placement member and perform heating in a pressurized state. Furthermore, a size of one placement member corresponds to a size of the board, and therefore, an area occupied by the electronic component connecting apparatus 490 becomes significantly smaller than the conventional reflow apparatus. Therefore, a total length I of the mounting system 401 can be reduced to about 2.5 m in the case of the present example.

Figure 25:
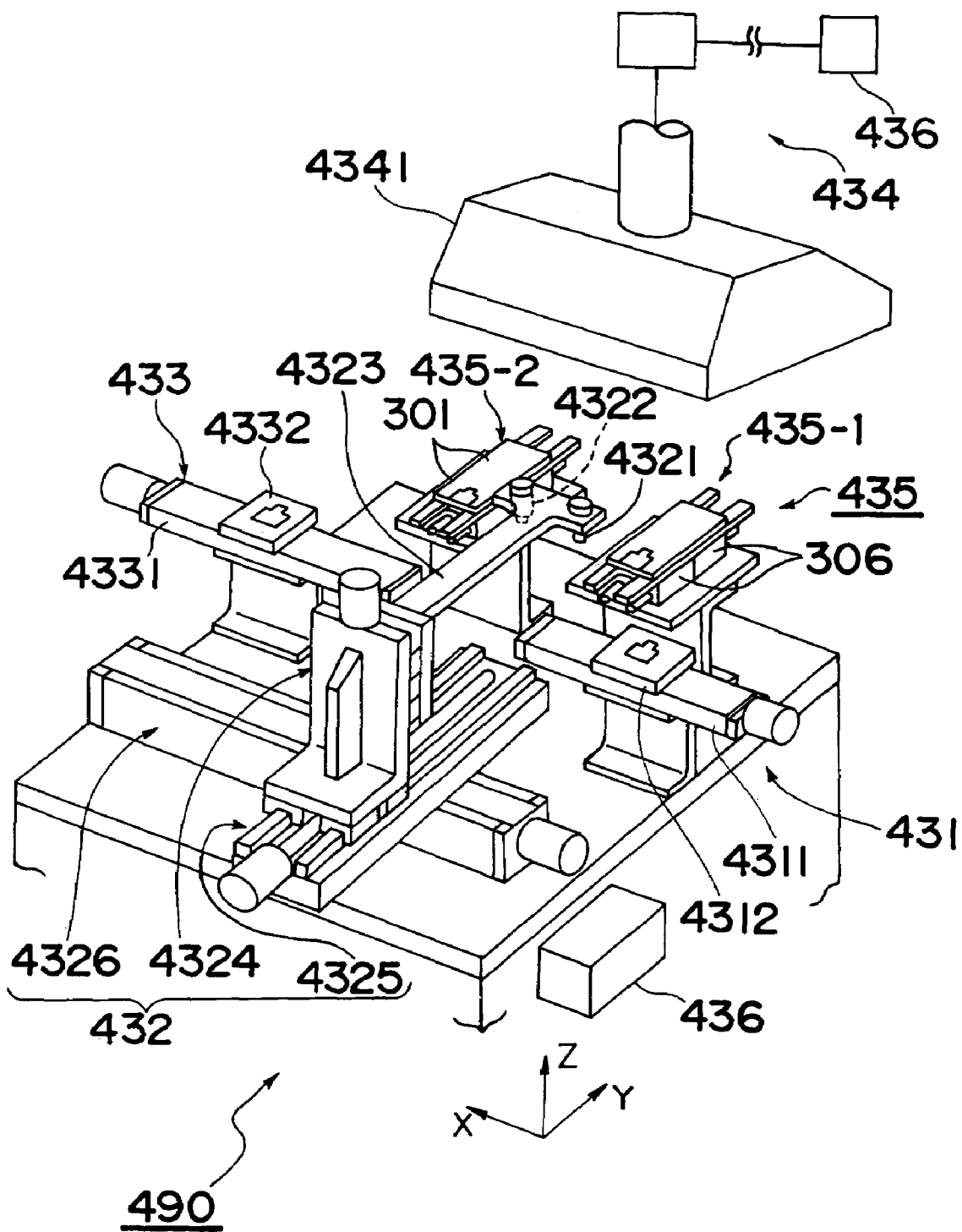
FIG. 25 is a schematic view showing a mounting system into which the electronic component connecting apparatus shown in FIG. 21 is incorporated.

A schematic view showing a construction of the electronic component connecting apparatus 490 provided for the mounting system 401 is shown in FIG. 25, and the electronic component connecting apparatus 490 will be described with reference to FIG. 25.

As shown in FIG. 25, the electronic component connecting apparatus 490 is provided with a heating section 435, a conveyance unit 431 for conveying the FPC 205 from the component placing apparatus 420 arranged adjacently on an upstream side (preceding process side) of the mounting system 401 into the electronic component connecting apparatus 490, a conveyance unit 433 for conveying the FPC 205 from the electronic component connecting apparatus 490 toward a downstream side (subsequent process side) of the mounting system 401, a conveyance unit 432 for conveying the FPC 205 from the conveyance unit 431 to the heating section 435 and from the heating section 435 to the conveyance unit 433, and a control unit 436 for executing operational control of these constituent sections.

The conveyance unit 431 is provided with a conveyance base 4312 that sucks and holds the FPC 205 and reciprocates in an illustrated X-axis direction of a conveyance direction by a drive unit 4311, and operation of the conveyance unit 431 is controlled by the control unit 436. The conveyance unit 433 is provided with a conveyance base 4332 that sucks and holds the FPC 205 and reciprocates in the illustrated X-axis direction by a drive unit 4331, and operation of the conveyance unit 433 is controlled by the control unit 436.

The heating section 435 is constructed of two stages, a first stage 435-1 and a second stage 435-2, and the first stage 435-1 and the second stage 435-2 are each constructed of two electronic component connecting apparatuses 316 of the third embodiment shown in FIG. 14 arranged in a longitudinal direction, i.e., in a Y-axis direction shown in FIG. 25. Therefore, a total of four electronic component connecting apparatuses 316 are employed in the heating section 435. This is because one FPC 205 to be processed by the mounting system 401 has a size corresponding to a size of two placement members 305 of the electronic component connecting apparatuses 316 arranged in the Y-axis direction. It is to be noted that a concrete size of the FPC 205 to be processed by the mounting system 401 is, for example, 35 mm×70 mm. As described above, the size of the stage is not limited to the form of the mounting system 401, and it is proper to determine the size in accordance with the size of the circuit board to be processed. Moreover, the number of the stages to be provided in the heating section 435 is also not limited to the present example but required to be at least one, and the number is determined on basis of processing performance required for the mounting system.

Moreover, a power supply, a pressurizing unit, a pressurizing mechanism and a cooling stage provided for each of the electronic component connecting apparatuses that constitute the stages 435-1 and 435-2 are not shown in FIG. 25 since they can be understood similarly to FIG. 14. Moreover, temperature control similar to temperature control described in connection with the third embodiment can be executed by operational control of the control unit 436 with regard to each of the first stage 435-1 and the second stage 435-2.

The conveyance unit 432 is provided with a conveyance suction unit 4321 that conveys the FPC 205 from the conveyance base 4312 of the conveyance unit 431 to the first stage 435-1 and the second stage 435-2 of the heating section 435, a conveyance suction unit 4322 that conveys the FPC 205 from the first stage 435-1 and the second stage 435-2 to the conveyance base 4332 of the conveyance unit 433, a Z-axis drive unit 4324 that moves a conveyance arm 4323 to which the conveyance suction unit 4321 and the conveyance suction unit 4322 are fixed in a Z-axis direction that is a direction of thickness of the FPC 205 and is perpendicular to the X-axis direction and the Y-axis direction, a Y-axis drive unit 4325 that moves the Z-axis drive unit 4324 in the Y-axis direction, and an X-axis drive unit 4326 that moves the Y-axis drive unit 4325 in the X-axis direction. The conveyance suction unit 4321 and the conveyance suction unit 4322 are each provided with a suction device (not shown). The conveyance unit 432, which has the above-mentioned construction, has its operation controlled by the control unit 436.

Further, the electronic component connecting apparatus 490 is provided with a suction unit 434 that has a duct 4341 for sucking fumes generated from the FPC 205 being heated by the heating section 435.

Operation of the mounting system 401 that has the aforementioned construction will be described below mainly with regard to operation of the electronic component connecting apparatus 490.

In the mounting system 401, a first FPC 205 conveyed from the component placing apparatus 420 is fed onto the conveyance base 4312 of the conveyance unit 431 provided for the electronic component connecting apparatus 490. The X-axis drive unit 4326, the Y-axis drive unit 4325, the Z-axis drive unit 4324 and the conveyance suction unit 4321, which are provided for the conveyance unit 432, are each driven, by which the FPC 205 is sucked and held by the conveyance suction unit 4321 and sucked and held while being placed on the first stage 435-1 of the heating section 435. Then, the FPC 205 is subjected to heating, i.e., a reflow operation by the heating stage 306 while being retained on the first stage 435-1 on basis of an aforementioned temperature profile. Fumes generated during this heating are sucked by the duct 4341 of the suction unit 434.

Next, a second FPC 205 carried into the electronic component connecting apparatus 490 is also handled similarly to the first FPC 205. This second FPC 205 is fed to the second stage 435-2 that is currently unoccupied and subjected to heating and control in terms of temperature for connection of the FPC 205 and chip components 206. Further, a next third FPC 205 is preparatorily sucked by the conveyance suction unit 431 and immediately fed to the first stage 435-1 after heating of the first FPC 205, conveyed first on the first stage 435-1, ends and this FPC is unloaded from the first stage 435-1 to the conveyance base 4332 of the conveyance unit 433 by the conveyance suction unit 4322 of the conveyance unit 432.

The FPC 205, which is placed on and sucked by the conveyance base 4332, is held and conveyed to a next process. By repeating the above-mentioned operation, FPCs 205 are successively processed.

According to the mounting system 401 provided with the electronic component connecting apparatus 490, the electronic component connecting apparatus 490 is constructed more compactly than in the conventional case, and therefore, a total scale of the mounting system 401 can be made more compact than in the conventional case.

Moreover, as shown in FIG. 26, the aforementioned mounting system 401 has a construction in which the solder feeding apparatus 410, the component placement apparatus 420 and the electronic component connecting apparatus 490 are arranged in a line along the board conveyance direction, i.e., the X-axis direction. However, an overall construction of the mounting system is not limited to the above-mentioned construction, and it is acceptable to constitute, for example, a rotary type mounting system 450 as shown in FIG. 27.

Figure 27:
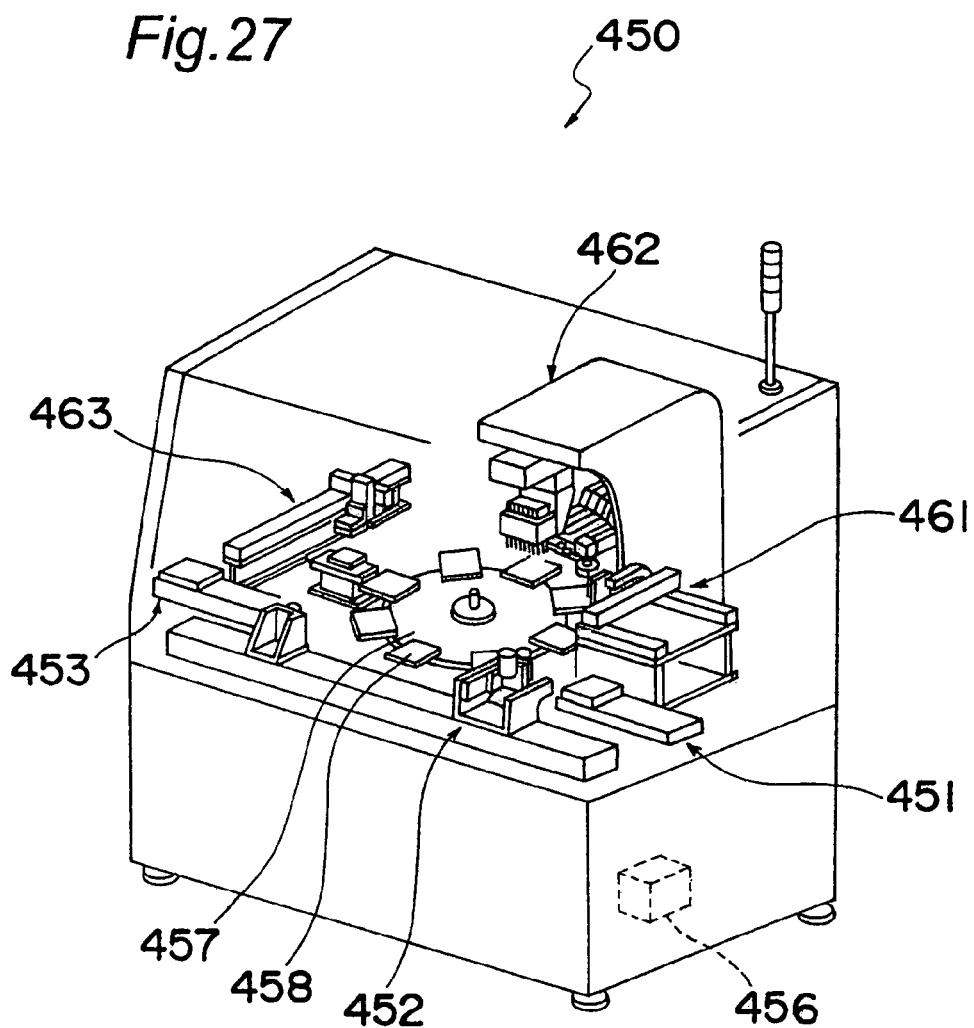
FIG. 27 is a schematic view showing yet another mounting system into which the electronic component connecting apparatus shown in FIG. 21 is incorporated.
Figure 28:
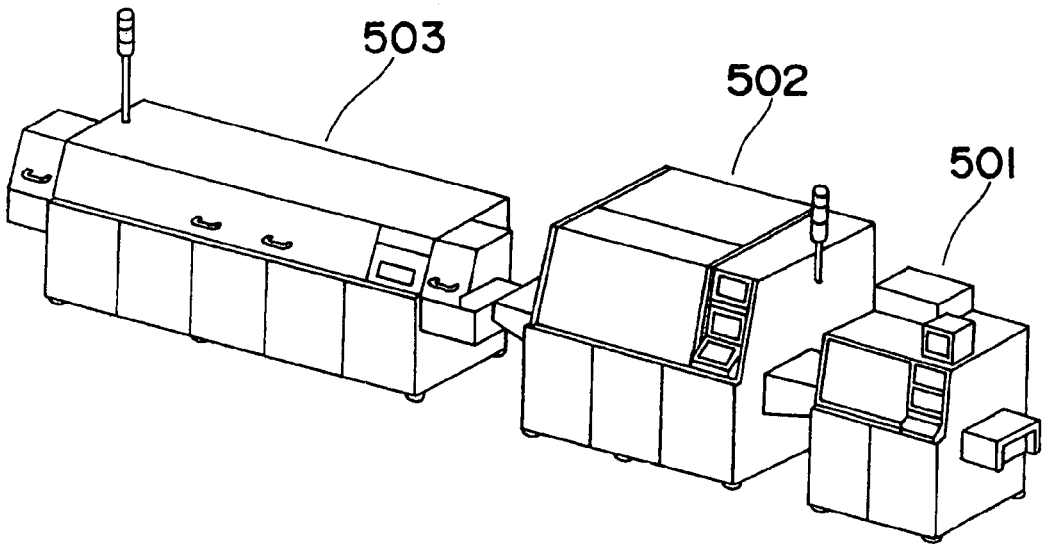
FIG. 28 is a schematic view showing a conventional mounting system.
Figure 29:
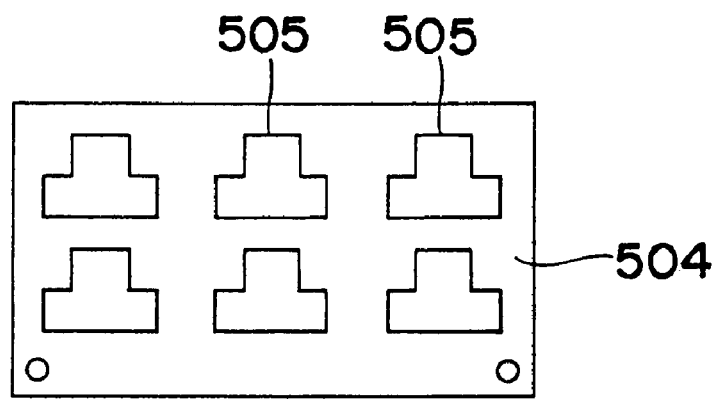
FIG. 29 is a schematic view showing conventional boards.
Figure 30:
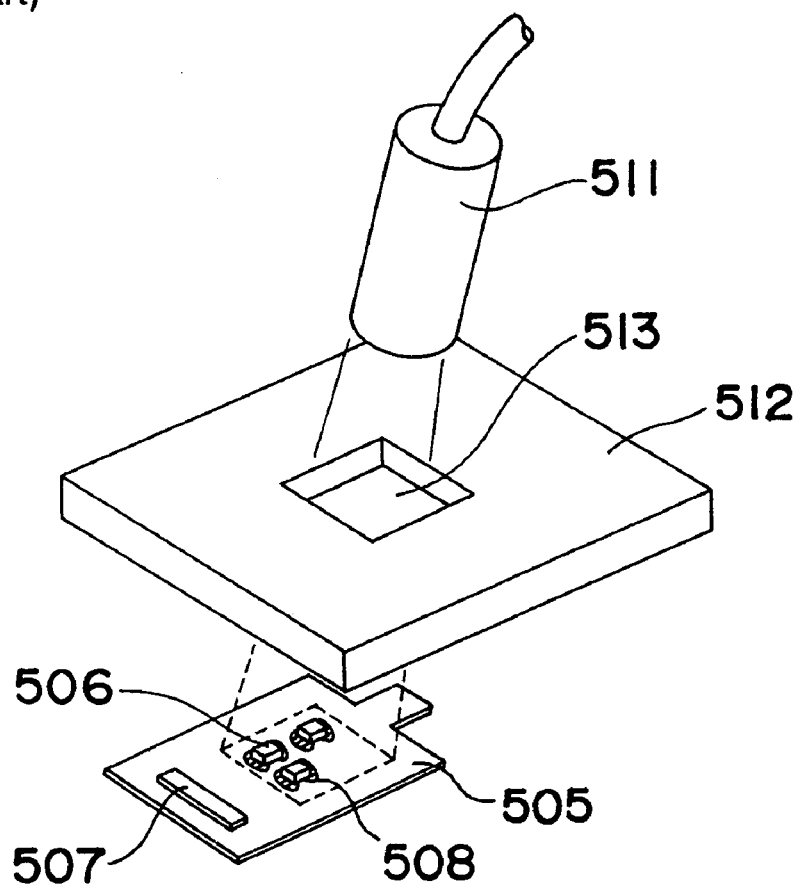
FIG. 30 is a schematic view showing a conventional board heating method.

As shown in FIG. 27, the mounting system 450 is provided with a solder feeding apparatus 461 in which a circular rotary table 457, of which a peripheral portion is provided with working sections 458 arranged at regular intervals, is intermittently rotatably provided in a central portion of the mounting system 450, and which surrounds the rotary table 457 and feeds solder to the board in correspondence with a stop position of working sections 458, a component placement apparatus 462 that places chip components 206 on a board fed with solder, and an electronic component connecting apparatus 463 that connects the chip components 206 to the board by heating the solder. Further, a control unit 456 that manages operational control of the mounting system 450 in its entirety is further provided. There are further provided a conveyance unit 451 for conveying a board from a preceding process to the mounting system 450, a conveyance unit 453 for conveying a board from the mounting system 450 to a next process, and a conveyance unit 452 for conveying a board to the working section 458. There is further provided a suction device for sucking fumes generated during heating of the board.

The mounting system 450 constructed as above operates as follows.

In the mounting system 450 shown in FIG. 27, a board is placed in the working section 458 by the conveyance unit 452 via the conveyance unit 451 and conveyed to the solder feeding apparatus 461 by rotation of the rotary table 457. In the solder feeding apparatus 461, solder is fed to the board. Then, the rotary table 457 rotates again, and the board is conveyed to the component placing apparatus 462. In the component placing apparatus 462, each chip component 206 is placed on the board fed with solder. Then, the rotary table 457 rotates again to convey the board to the electronic component connecting apparatus 463. In the electronic component connecting apparatus 463, heating of the board and connection of the component to the board are performed. Subsequently, the board is placed on the conveyance unit 453 by the conveyance unit 452, and the conveyance unit 453 conveys the board to the next process.

For example, when a first board is heated by the electronic component connecting apparatus 463, components are placed on a second board by the component placing apparatus 462, and solder is fed to a third board by the solder feeding apparatus 461. As described above, different processes are concurrently performed for a plurality of boards in the mounting system 450.

Further, as in the mounting system 450, a width of the mounting system 450 can be further reduced by adopting a form provided with the rotary table 457.

Moreover, if a stop position of the rotary table 457 is divided into eight positions, it is possible to further provide a recognition camera for inspecting a state of feed of solder to the board and a device for adding solder to portions fed with insufficient solder between the solder feeding apparatus 461 and the component placing apparatus 462, and to effectively utilize these devices. Moreover, the electronic component connecting apparatus 463 can also be provided inside the working section 458, at the conveyance unit 453, or between the rotary table 457 and the conveyance unit 453.

It is to be noted that, by properly combining arbitrary embodiments of the aforementioned various embodiments, effects possessed by each of them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2003-275941 filed on Jul. 17, 2003 and No. 2004-031778 filed on Feb. 9, 2004 including specification, drawing and claims are incorporated herein by reference in its entirety.

What is claimed is:

1. A component connecting apparatus comprising:
  a placement member onto which is to be placed a board that receives thereon a component with interposition of connection material, the component having a connection portion, to be connected to an electrode of the board via the connection material, and a weak heat-resistant portion having a heat-proof temperature lower than a fusing point of the connection material;
  a heating device having a heating member for heating said placement member so as to heat the board when in contact with said placement member by virtue of being placed on said placement member, and for thereby fusing the connection material;
  a weak heat-resistant portion cooling device having a cooling member for cooling the weak heat-resistant portion or the vicinity of the weak heat-resistant portion by coming into contact with the weak heat-resistant portion or the vicinity of the weak heat-resistant portion, and thereby conducting heat from the component so as to prevent thermal damage to the weak heat-resistant portion by reducing a quantity of heat conducted from said heating device to the weak heat-resistant portion via the board; and a pressing unit for pressing the board against said placement member such that the board closely fits said placement member and said placement member closely fits said heating member, such that the component is to become connected to the board by fusing the connection material, via heating of said placement member by said heating member, while cooling the weak heat-resistant portion or the vicinity of the weak heat-resistant portion, via said cooling member being in contact with the weak heat-resistant portion or the vicinity of the weak heat-resistant portion, and then solidifying the fused connection material.

2. The component connecting apparatus according to claim 1, wherein said cooling member is for cooling the weak heat-resistant portion or the vicinity of the weak heat-resistant portion such that a temperature of the weak heat-resistant portion becomes no greater than the heat-proof temperature of the weak heat-resistant portion during fusing of the connection material via heating of said placement member by said heating member.

3. The component connecting apparatus according to claim 1, wherein the weak heat-resistant portion is inside the component, and said cooling member is to be brought into indirect contact with the weak heat-resistant portion by coming into contact with the vicinity of the weak heat-resistant portion.

4. The component connecting apparatus according to claim 1, wherein said cooling member is to be brought into indirect contact with the weak heat-resistant portion by coming into contact with the board.

5. The component connecting apparatus according to claim 1, wherein said placement member has a placement surface, such that when the board is placed on said placement member the board is placed on said placement surface with a part of the board in the vicinity of the electrode of the board being in contact with said placement surface.

6. The component connecting apparatus according to claim 1, further comprising:

a suction device, connected to said placement member, for causing the board to be sucked and held to said placement member.

7. The component connecting apparatus according to claim 1, wherein said weak heat-resistant portion cooling device further has a cooling member moving unit for moving said cooling member between a position at which said cooling member is in contact with the weak heat-resistant portion or the vicinity of the weak heat-resistant portion, and a position at which said cooling member is not in contact with the weak heat-resistant portion or the vicinity of the weak heat-resistant portion.

8. The component connecting apparatus according to claim 7, wherein said cooling member is positioned opposite said placement member, such that when said cooling member is moved by said cooling member moving unit to the position at which said cooling member is in contact with the weak heat-resistant portion or the vicinity of the weak heat-resistant portion, retained is a position where the board is placed on said placement member.

9. The component connecting apparatus according to claim 1, wherein said cooling member is of a material having a thermal conductivity greater than a thermal conductivity of a formation material of the component.

10. The component connecting apparatus according to claim 1, further comprising:

a control unit for controlling a temperature of said placement member to be at a constant temperature via heating by said heating member, and for controlling a heating temperature profile of the connection material and a temperature profile of the weak heat-resistant portion by controlling an amount of time of contact between the board and said placement member whose temperature is controlled to be at the constant temperature, and by controlling an amount of time of contact between said cooling member and the weak heat-resistant portion or the vicinity of the weak heat-resistant cooling portion.

11. The component connecting apparatus according to claim 1, wherein said pressing unit includes protruding portions or configured portions for pressing the board against said placement member.

12. A component connecting apparatus comprising:

a placement member onto which is to be placed a board that receives thereon a component with interposition of connection material, the component having a connection portion, to be connected to an electrode of the board via the connection material, and a weak heat-resistant portion having a heat-proof temperature lower than a fusing point of the connection material;

a heating device for heating said placement member so as to heat the board when in contact with said placement member by virtue of being placed on said placement member, and for thereby fusing the connection material; and a weak heat-resistant portion cooling device having a cooling member for cooling the weak heat-resistant portion or the vicinity of the weak heat-resistant portion by coming into contact with the weak heat-resistant portion or the vicinity of the weak heat-resistant portion, and thereby conducting heat from the component so as to prevent thermal damage to the weak heat-resistant portion by reducing a quantity of heat conducted from said heating device to the weak heat-resistant portion via the board, said cooling member having a cooling fluid passage for allowing a cooling fluid to pass therethrough such that heat conducted from the component to said cooling member can be removed by passing the cooling fluid through said cooling fluid passage, such that the component is to become connected to the board by fusing the connection material, via heating of said placement member by said heating device, while cooling the weak heat-resistant portion or the vicinity of the weak heat-resistant portion, via said cooling member being in contact with the weak heat-resistant portion or the vicinity of the weak heat-resistant portion, and then solidifying the fused connection material.

* * * * *